United States Patent [19]

Mukaida et al.

[11] Patent Number: 5,593,950
[45] Date of Patent: Jan. 14, 1997

[54] LATTICE MATCHING SUPER CONDUCTING DEVICE WITH A- AND C- AXES

[75] Inventors: Masashi Mukaida; Shintaro Miyazawa, both of Isehara; Junya Kobayashi, Yokohama, all of Japan

[73] Assignee: Nippon Telegraph & Telephone Corporation, Chiyoda-ku, Japan

[21] Appl. No.: 97,235

[22] Filed: Jul. 27, 1993

[30] Foreign Application Priority Data

| | | | |
|---|---|---|---|
| Jul. 28, 1992 | [JP] | Japan | 4-220778 |
| Aug. 24, 1992 | [JP] | Japan | 4-223796 |
| Sep. 9, 1992 | [JP] | Japan | 4-240501 |

[51] Int. Cl.$^6$ .......................... H01L 39/00; H01L 39/22; H01L 39/24
[52] U.S. Cl. .......................... 505/234; 505/190; 505/238; 505/702; 257/33; 257/35
[58] Field of Search .......................... 257/31, 32, 33, 257/34, 35, 36, 37, 38, 39, 661, 662, 663; 505/110, 150, 190, 191, 220, 234, 237, 238, 239, 330, 700, 701, 702, 703, 725, 775, 780, 779

[56] References Cited

U.S. PATENT DOCUMENTS

| | | | |
|---|---|---|---|
| 4,509,001 | 5/1986 | Saskai et al. | 357/5 |
| 5,047,385 | 9/1991 | Beasley et al. | 503/742 |
| 5,077,266 | 12/1991 | Takagi et al. | 257/34 |
| 5,106,823 | 4/1992 | Creuzet et al. | 257/33 |
| 5,157,466 | 10/1992 | Char et al. | 257/34 |
| 5,236,896 | 8/1993 | Nakamura et al. | 257/34 |

FOREIGN PATENT DOCUMENTS

| | | | |
|---|---|---|---|
| 307246A3 | 3/1989 | European Pat. Off. | |
| 0446145 | 9/1991 | European Pat. Off. | |
| 0465326 | 1/1992 | European Pat. Off. | 259/31 |
| 0490776 | 6/1992 | European Pat. Off. | |
| 0502787 | 9/1992 | European Pat. Off. | |
| 0557207 | 8/1993 | European Pat. Off. | |
| 64-39084 | 2/1989 | Japan | 257/33 |
| 1-241874 | 9/1989 | Japan | 257/34 |
| 4-167578 | 6/1992 | Japan | 257/661 |
| 4-168779 | 6/1992 | Japan | 257/661 |
| 4-302183 | 10/1992 | Japan | 257/31 |

OTHER PUBLICATIONS

Applied Physics Letters, vol. 57, No. 7, Aug. 13, 1990 pp. 727–729, "Low Noise $YBa_2Cu_3O_{7-\delta}$ Grain Boundary Junction dc Squids", R. Gross et al.

Superconductor Science and Technology, vol. 4, No. 9, Sep. 1991, pp. 482–484, "Investigation of Step–Edge Microbridges for Application As Microwave Detectors", M. Daginnus et al.

Applied Physics Letters, vol. 54, No. 26, Jun. 26, 1989 pp. 2719–1721, "Epitaxial Growth and Critical Current Density of Thin Films of $YBaCu_3O_{7-x}$ On $LaAlO_3$ Substrates", Mogro–Campero, et al.

Japanese Journal of Applied Physics, Part 2, Letters vol. 30, No. 8A, Aug. 1, 1991, pp. L1355–L1358, "Microstructure and Microwave Properties of $YBa_2Cu_3O_{7-\delta}$ Thin Films Grown on $NdGaO_3$,·· H. Young et al.

Applied Physics Letters, vol. 59, No. 6, Aug. 5, 1991 pp. 733–735, "Bi–epitaxial Grain Boundary Junctions in $YBa_2Cu_3O_7$" K. Char et al.

(List continued on next page.)

Primary Examiner—Sara W. Crane
Assistant Examiner—Alice W. Tang
Attorney, Agent, or Firm—Spencer & Frank

[57] ABSTRACT

A lattice matching device includes a substrate having thereon monocrystal regions having different lattice mismatches with respect to a $LnBa_2Cu_3O_x$ superconductor. A superconducting thin film is formed on the substrate, which film consists essentially of a superconductor of $LnBa_2Cu_3O_x$ wherein Ln represents yttrium or a lanthanide, and $6<x<7$. The first and second superconducting thin film portions have different axes of orientation perpendicular to a main surface of the substrate, and arranged in contact with each other or at a distance which allows transmission of electron pairs from one to another.

5 Claims, 18 Drawing Sheets

OTHER PUBLICATIONS

IBM Technical Disclosure Bulletin, vol. 34, No. 3, Aug. 1991, "Anisotropic Superconducting Devices" pp. 111–112, R. H. Koch et al.

Linker et al., "Control of Growth Direction of Epitaxial $YBa_2CuO$ Thin Films on $SrTiO_3$–Substrates", Solid State Communications, vol. 69, No. 3, Mar. 1989, pp. 249–253.

Homma et al., "Crystallinity of a–axis Oriented $YBa_2Cu_3O_{7-\delta}$ Thin Film Epitaxially Grown on $NdGaO_3(110)$ by 95 MHz Magnetron Sputtering", Appl. Phys. Lett., vol. 59, No. 11, Sep. 9, 1991, pp. 1383–1385.

Appl. Phys. Lett., vol. 59, No. 20, Nov., 1991; "Epitaxial Growth and Properties of $YBa_2Cu_3O_{7-\delta}/NdGaO_3/YBa_2Cu_3O_{7-\delta}$ Trilayer Structures", Boikov et al., pp. 2606–2608.

Applied Phys. Lett. vol. 61, No. 4, Jul., 1992; "Laser–Deposited $PrGaO_3$ Films on $SrTiO_3$ Substrates and in $YBa_2Cu_3O_7/PrGaO_3/YBa_2Cu_3O_7$ Trilayers", Brorsson et al., pp. 486–488.

Appl. Phys. Lett., vol. 61, No. 21, Nov., 1992; "Synthesis and Properties of a–axis and b–axis oriented $GdBa_2Cu_3O_{7-\delta}$ High $T_c$ Thin Films", Nakamura et al., pp. 2598–2600.

Appl. Phys. Lett., vol. 57, No. 23, Dec., 1990; "A–axis Oriented Epitaxial $YBa_2Cu_3O_{7-x}$–$PrBa_2Cu_3O_{7-y}$ Heterostructures", Inam et al., pp. 2484–2486.

Appl. Phys. Lett., vol. 60, No. 14, Apr. 1992; "Josephson Characteristics in a–axis Oriented $YBa_2Cu_3O_{7-\delta}$ /$PrBa_2Cu_3O_{7-\delta}$/$YBa_2Cu_3O_{7-\delta}$ Junctions", Hashimoto et al., pp. 1756–1758.

Appl. Phys. Lett., vol. 61, No. 9, Aug. 1992; "A–axis Oriented Growth of $YBa_2Cu_3O_{7-y}$ Films on $LaSrGaO_4(100)$ Susbstrates", Hontsu et al., pp. 1134–1136.

Appl. Phys. Lett., vol. 56, No. 7, Feb., 1990; "All High $T_c$ Edge Junctions and SQUIDs", Laibowitz et al., pp. 686–688.

J. App. Phys. vol. 64, No. 3, Aug., 1988; "Preferentially Oriented Epitaxial Y–Ba–Cu–O Films Prepared By the Ion Beam Sputtering Method", Fujita et al., pp. 1292–1295.

Appl. Phys. Lett., vol. 58, No. 22, Jun., 1991; "Submicron $YBa_2Cu_3O_{7-\delta}$ Gain Boundary Junction dc SQUIDs" Kawasaki et al., pp. 2555–2557.

Appl. Phys. Lett., vol. 58, No. 22, Jun., 1991; "Practical High $T_c$ Josephson Junctions and dc SQUIDs Operating Above 85 K", DiIorio et al.; pp. 2552–2554.

11th Symposium On Future Electron Devices, Nov., 1992; "Grain Boundary Junctions in High $T_c$ Superconductors", Kawasaki et al.

Jpn. J. Appl. Phys., vol. 31, Oct. 1992; "Growth and Crystallographic Analysis of $YBa_2Cu_3O_x$ Thin Films on $NdGaO_3$ Substrates", Mukaida et al., pp. 3317–3322.

Jpn. J. Appl. Phys., vol. 29, No. 12, Dec. 1990; "Crystal Orientation of $YBa_2Cu_3O_{7-y}$ Thin Films Prepared By RF Sputtering", Arikawa et al., pp. L2199–2202.

J. Mater. Res., vol. 7, No. 3, Mar. 1992; "Textures Of Laser Ablated Superconducting Thin Films of $YBa_2Cu_3O_{7-\delta}$ As A Function of Deposition Temperature" Heidelbach et al., pp. 549–557.

Reports, Sept. 28, 1990; "Epitaxial and Smooth Films of a–Axis $YBa_2Cu_3O_7$", Eom et al., pp. 1549–1552.

American Physical Society, vol. 68, No. 7, Feb., 1992; "$1/f$ Noise in $YBa_2Cu_3O_{7-\delta}$ Superconducting Bicrystal Grain–Boundary Junctions", Kawasaki et al.

*Advances in Superconductivity IV*, Hayakawa et al., Oct. 14–17, 1991, 4th International Symposium on Superconductivity; "Preparation of a–Axis Oriented YBCO Films by Template Procedure", Matsuda et al. pp. 719–722.

*Advances in Superconductivity V*, Bando et al., 5th International Symposium on Superconductivity; "Quasi–Lattice–Match Engineering for Preferential Axis Control of $YBa_2Cu_3O_x$ Thin Films".

Jpn. Society of Applied Physics and Related Societies, Article No. 31–GA–10, Extended Abstract, Mukaida et al. "Growth oif a–Axis Oriented $YBa_2Cu_3O_x$ Thin Films By QLME".

Jpn. Society of Applied Physics, Article No. 16p–F–17, Extended Abstract, Mukaida et al., "Effect o Lattice Matching on Preferential Orientation of $YBa_2Cu_3O_x$ Thin Films".

LATTICE MATCHING SUPER CONDUCTING DEVICE WITH A- AND C- AXES

BACKGROUND OF THE INVENTION

1. Field of the Invention

The present invention relates to a lattice matching device and a method for fabricating the same and more particularly to a lattice matching device such as a superconducting thin film grain boundary junction device, a superconducting thin film vertical junction device, or a superconducting thin film interlaminer or interlayer wiring in a three dimensional integrated circuit and a method for fabricating such device.

2. Description of the Prior Art $La_{2-x}M_xCuO_{4-y}$ (M: Sr, Ba, 0<x<1) discovered in 1986 has a superconductivity transition temperature ($T_c$) of 30–40K which is much higher than the $T_c$ of conventional metal superconductors and, hence, extensive research on oxide superconductors has been conducted. As a result, $LnBa_2Cu_3O_x$ (Ln: Y or lanthanides; 6<x<7) oxide superconductors having a $T_c$ of about 90K, $BiSrCaCuO_x$ oxide superconductors having a $T_c$ of about 110K, and TlBaCaCu $O_x$ oxide superconductors having a $T_c$ of about 120K have been discovered one after another.

Various junction devices have been reported which utilize, among these high temperature superconductors, $YBa_2Cu_3O_x$. These junction devices are classified into two groups; one is a group of vertical junction devices and the other is a group of lateral junction devices.

The lateral junction devices include (1) a junction using a so-called bicrystal substrate which has two substrate regions adjacent each other differing in the direction of their crystal axis from each other, and (2) a 45°-inclined junction having a first thin film formed on $SrTiO_3$ and a second thin film formed on MgO in which the first and second thin films have different intraplanar directions from each other.

Next, an explanation will be made of the junction using a bicrystal substrate. FIG. 1A is a planar view showing a thin film, and FIG. 1B is a cross sectional view showing the thin film shown in FIG. 1A. In FIGS. 1A and 1B, reference numerals 31, 31' are $SrTiO_3$ substrates, respectively. The $SrTiO_3$ substrates 31 and 31' have a crystal axes with different directions Reference numeral 38 designates a junction portion at which the $SrTiO_3$ substrates 31 and 31' differing in the direction of crystal axis one from another, are adjacent to each other. Reference numerals 33 and 33' are $YBa_2Cu_3O_x$ thin films, respectively, formed on the bicrystal substrate. Arrows c indicate the direction of the c-axes of the thin films 33, 33' and arrows a/b indicate the directions of the a- or b-axes of the thin films 33 and 33'. Reference numeral 35 designates an inclined grain boundary junction.

With this junction, $CuO_2$ planes (a- or b-planes), in which electric current flows, exist in the same plane in both electrodes that sandwich the junction and contact each other in a parallel relation. With this arrangement, the leak current increases.

Next, an explanation will be made of the 45°-inclined junction referring to FIGS. 2A and 2B. FIG. 2A is a planar view showing a conventional thin film, and FIG. 2B is a cross sectional view showing the thin film shown in FIG. 2A. In FIG. 2B, reference numeral 41 designates a sapphire substrate, 42 is a MgO thin film formed on a part of a surface of the sapphire substrate 41, 43 is a $SrTiO_3$ thin film located over the MgO thin film 42 and the remaining part of the surface of the sapphire substrate 41, and 44 and 44' are c-axis oriented $YBa_2Cu_3O_x$ thin films, respectively, formed on the $SrTiO_3$ thin film 43. Reference numeral 45 designates a grain boundary junction formed between the thin films 44 and 44'. Arrows c indicate the direction of the c-axes of the $YBa_2Cu_3O_x$ thin films 44 and 44', and arrows a/b indicate the direction of a- or b-axes of the $YBa_2Cu_3O_x$ thin films 44 and 44', respectively.

As will be understood from FIGS. 2A and 2B, the axes of preferential orientation of the electrodes sandwiching the grain boundary junction 45 are the same as the c-axis while the $YBa_2Cu_3O_x$ thin films 44 and 44' form a 45°-inclined junction. In this case, too, $CuO_2$ planes (a- or b-planes), in which electric current flows, exist in the same plane in both electrodes sandwiching the junction and contact each other in a parallel relation, as in the case of the bicrystal. As a result, the $CuO_2$ planes in the $YBa_2Cu_3O_x$, in which electric current flows, always exist in the planes of the $YBa_2Cu_3O_x$ thin films 44 and 44', and the $CuO_2$ planes contact each other always in parallel (a/b-axis direction vs. a/b-axis direction) in a boundary region of the junction and in both electrode portions. This arrangement causes a serious problem of an increase in the leak current.

In the case of vertical junctions, the use of a c-axis oriented film, in which superconducting current flows more easily in a thin film plane, as an electrode gives rise to a junction portion having a smaller coherence length in the c-axis direction, causes a problem in that no superconducting current can flow through the fabricated junction. On the other hand, when there is used an a-axis oriented thin film that has a larger coherence length in the direction of the junction plane and in which superconducting current flows more easily, it is difficult for current to flow in the plane of the thin film, resulting in a decreased current density. Therefore, thicker wiring is required, which makes it difficult to reduce the size of the device.

Further, superconducting current flows in a c-axis oriented portion having a small coherence length at a critical current density by several digits smaller than an a-axis oriented portion having a large coherence length. Hence, in a highly integrated three dimensional circuit having a pair of adjacent c-axis oriented thin films, superconducting current must flow through a c-axis oriented portion having a small coherence length at the time of transmission and receipt of signals from a lower circuit layer to an upper circuit layer. The a-axis oriented portion having a small coherence length serves as an interlayer wiring region. In this interlayer wiring region, the cross section must be large so that the density of the signal current does not exceed a critical current density. This makes it difficult to achieve the high integration of circuits.

SUMMARY OF THE INVENTION

An object of the present invention is to provide a superconducting thin film device in which a desired region on a substrate has a desired preferential orientation and a method for fabricating such a device.

Another object of the present invention is to provide a superconducting thin film grain boundary junction device including a substrate having formed thereon a grain boundary junction whose $CuO_2$ planes in which current flows cross each other at right angles and exhibit less leak current, and a method for fabricating such a device.

Still another object of the present invention is to provide a superconducting thin film vertical junction device which realizes a reduction in the size of the wiring and a decrease in the junction area, and a method for fabricating such a device.

Yet another object of the present invention is to provide a highly integrated oxide superconductor circuit including a superconducting thin film having a controlled crystallographic axis of preferential orientation by selection of the material used for an underlying layer and having a direction of larger coherence length in a plane of the thin film, with only a region which serves as an interlayer wiring having a larger coherence length direction perpendicular to a superconducting wiring layer and thus having a decreased area of the interlayer wiring, and a method for fabricating such a circuit.

According to a first aspect, the present invention provides a lattice matching device comprising: a substrate; a superconducting thin film deposited on the substrate and consisting essentially of a superconductor represented by the formula $LnBa_2Cu_3O_x$ wherein Ln represents yttrium or a lanthanide, and x satisfies $6<x<7$; the substrate having first and second monocrystal regions; the superconducting thin film having first and second superconducting thin film portions formed on the first and second monocrystal regions, respectively; the first and second monocrystal regions having lattice mismatches with respect to the $LnBa^2Cu_3O_x$ which are different from each other; the first and second superconducting thin film portions having axes of orientation perpendicular to a main surface of the substrate, the axes of orientation differing from each other; and the first and second superconducting thin film portions being arranged in contact with each other or at a distance which allows transmission of electron pairs from one to another.

Here, the first and second superconducting thin film portions may be in grain boundary contact with each other.

The lattice matching device may further comprise an interlayer wiring portion connecting the first and second superconducting thin film portions to each other, and in which the first and second superconducting thin film portions comprise upper and lower superconducting thin film layers, respectively; layers of the second superconducting thin film portion having a larger coherent length region having a larger coherence length in a direction perpendicular to a surface of the thin film and the upper and lower layers of the first superconducting film portion having a smaller coherent length region having a smaller coherence length in a direction perpendicular to a surface of the thin film, arranged adjacent to each other, the upper and lower superconducting thin film layers being arranged at a distance which allows transmission of electron pairs therebetween in the smaller coherence length region; and the smaller coherence length region constituting the wiring portion.

Both of the upper and lower superconducting thin film layers may have a larger coherent length region having a larger coherence length in a direction perpendicular to a surface of the thin film and a smaller coherent length region having a smaller coherence length in a direction perpendicular to a surface of the thin film, arranged adjacent to each other; the larger coherence length regions of the upper and lower superconducting thin film layers comprise a common thin film which constitutes the interlayer wiring.

The upper and lower superconducting thin films may be joined through an insulator thin film provided therebetween.

The substrate may consist of a material selected from the group consisting of $Nd:YAlO_3$, $LaAlO_3$, $SrLaGaO_4$, $NdGaO_3$, $PrGaO_3$, $LaGaO_3$, $SrTiO_3$ and $MgO$.

According to a second aspect, the present invention provides a superconducting thin film grain boundary junction device comprising: a substrate; first and second monocrystal regions provided in the substrate and having lattice mismatches with respect to a superconductor represented by the formula $LnBa_2Cu_3O_x$ wherein Ln represents yttrium or a lanthanide, and x satisfies $6<x<7$, the lattice mismatches differing from each other; a superconducting thin film composed of a superconductor represented by formula $LnBa_2Cu_3O_x$ wherein Ln represents yttrium or a lanthanide, and x satisfies $6<x<7$, the superconducting thin film having axes of orientation in a direction perpendicular to a surface of the superconducting thin film in the regions, respectively, the axes of orientation differing in different regions.

Here, the substrate may consist of a material selected from the group consisting of $Nd:YAlO_3$, $LaAlO_3$, $SrLaGaO_4$, $NdGaO_3$, $PrGaO_3$, $LaGaO_3$, $SrTiO_3$ and $MgO$.

According to a third aspect, the present invention provides a superconducting thin film vertical junction device comprising: a substrate; upper and lower superconducting thin film layers each composed of a superconductor represented by formula $LnBa_2Cu_3O_x$ wherein Ln represents yttrium or a lanthanide, and x satisfies $6<x<7$; an insulator thin film sandwiched between the upper and lower $LnBa_2Cu_3O_x$ layers; a wiring portion connecting the upper and lower superconducting thin film layers; at least one of the upper and lower superconducting thin film layers having a larger coherent length region having a larger coherence length in a direction perpendicular to a surface of the thin film and a smaller coherent length region having a smaller coherence length in a direction perpendicular to a surface of the thin film, arranged adjacent to each other; the upper and lower superconducting thin film layers being joined in the larger coherence length region; and the smaller coherence length region constituting the wiring portion.

Here, the substrate may consist of a material selected from the group consisting of $Nd:YAlO_3$, $LaAlO_3$, $SrLaGaO_4$, $NdGaO_3$, $PrGaO_3$, $LaGaO_3$, $SrTiO_3$ and $MgO$.

According to a fourth aspect, the present invention provides a superconducting thin film interlayer wiring in a three dimensional integrated circuit having: a substrate; upper and lower integrated circuits formed on the substrate; an interlayer wiring connecting the upper and lower integrated circuits; and an oxide superconductor provided on the substrate, wherein the substrate has deposited thereon at least two materials having lattice mismatches with respect to a superconductor represented by a formula $LnBa_2Cu_3O_x$ wherein Ln represents yttrium or a lanthanide, and x satisfies $6<x<7$, respectively, the lattice match differing one from another, each in at least one region; wherein the interlayer wiring comprises: a superconducting thin film composed of a superconductor represented by formula $LnBa_2Cu_3O_x$ wherein Ln represents yttrium or a lanthanide, and x satisfies $6<x<7$; the superconducting thin film having a larger coherent length region having a larger coherence length in a direction perpendicular to a surface of the thin film and a smaller coherent length region having a smaller coherence length in a direction perpendicular to a surface of the thin film; and the larger coherent length region of the superconducting thin film constituting the interlayer wiring connecting the upper and lower integrated circuits to each other.

Here, the substrate may consist of a material selected from the group consisting of $Nd:YAlO_3$, $LaAlO_3$, $SrLaGaO_4$, $NdGaO_3$, $PrGaO_3$, $LaGaO_3$, $SrTiO_3$ and $MgO$.

According to a fifth aspect, the present invention provides a method for fabricating a lattice matching device, comprising the steps of: providing a substrate; forming on a surface of the substrate at least two monocrystal regions having lattice mismatches with respect to a superconductor represented by a formula $LnBa_2Cu_3O_x$ wherein Ln represents yttrium or a lanthanide, and x satisfies 6<x<7, the lattice mismatches differing one from another; forming on each of the at least two monocrystal regions a thin film of a superconductor represented by a formula $LnBa_2Cu_3O_x$ wherein Ln represents yttrium or a lanthanide, and x satisfies 6<x<7, in such a manner that the $LnBa_2Cu_3O_x$ thin film has different axis of orientation in a direction perpendicular to a surface of the substrate in different region.

Here, the $LnBa_2Cu_3O_x$ thin film may be simultaneously formed in each of the monocrystal regions having different lattice mismatch from each other at a predetermined substrate temperature.

The substrate may consist of a material selected from the group consisting of $Nd:YAlO_3$, $LaAlO_3$, $SrLaGaO_4$, $NdGaO_3$, $PrGaO_3$, $LaGaO_3$, $SrTiO_3$ and MgO.

According to the present invention, a grain boundary junction whose $CuO_2$ planes in which superconducting current flows and which are in contact perpendicular to each other can be fabricated easily and with high yield, the junction showing less leakage current.

Further, according to the present invention, a vertical junction uses as electrodes a thin film whose axis having a larger coherence length is an axis of preferential orientation in a junction portion and exists in a plane of the thin film in a wiring portion and, hence, a thin film can be fabricated which has a c-axis orientation, i.e., an orientation in which the a-/b-plane, that allows current to pass easily therethrough (having a larger coherence length), in the surface of the thin film in a region serving as a wiring portion while in a region serving as a lower electrode of the junction, a thin film can be fabricated that has an a-axis orientation, i.e., having a-/b-plane, that allows current to pass easily therethrough, perpendicular to the thin film surface c-axis orientation, thus realizing reduction in the size of wiring and decrease in the area of junction simultaneously.

Still further, according to the present invention, an interlayer wiring structure is comprised by a thin film which has a larger coherence length axis (a-/b-plane that allows current to pass easily therethrough) as an axis of preferential orientation in a wiring portion while in a thin film portion in an integrated circuit, a smaller coherence length axis (c-axis in which direction current flow is difficult) as an axis of preferential orientation, i.e., a thin film having a-/b-plane, that allows current to flow easily therethrough, in a thin film surface, thus realizing reduction in the size of interlayer wiring and reduction in the size of upper and lower integrated circuits.

The above and other objects, effects, features and advantages of the present invention will become more apparent from the following description of embodiments thereof taken in conjunction with the accompanying drawings.

DETAILED DESCRIPTION OF THE INVENTION

The lattice matching device of the present invention includes, for example, a superconducting thin film grain boundary junction device, a superconducting thin film vertical junction device, and an interlayer wiring in a three dimensional integrated circuit, each having a superconducting thin film consisting essentially of $LnBa_2Cu_3O_x$ (Ln: Y or lanthanides).

Figure 1A:
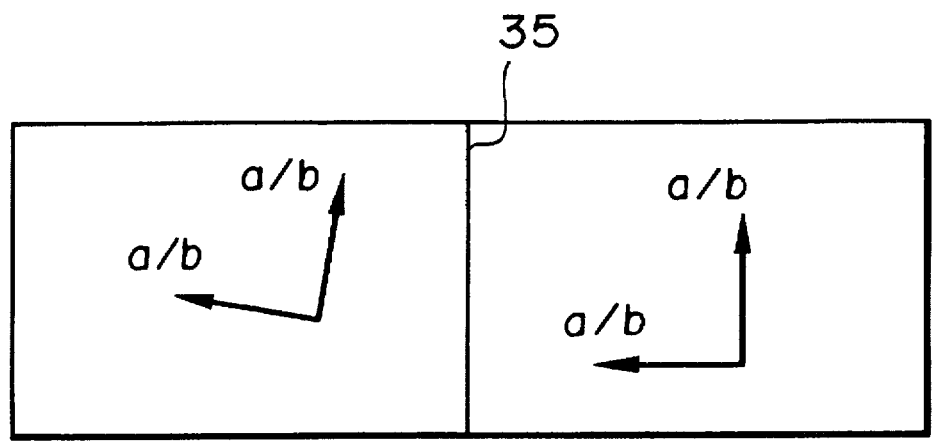
FIG. 1A is a planar view showing a conventional thin film planar grain boundary junction having a bicrystal substrate.
Figure 1B:
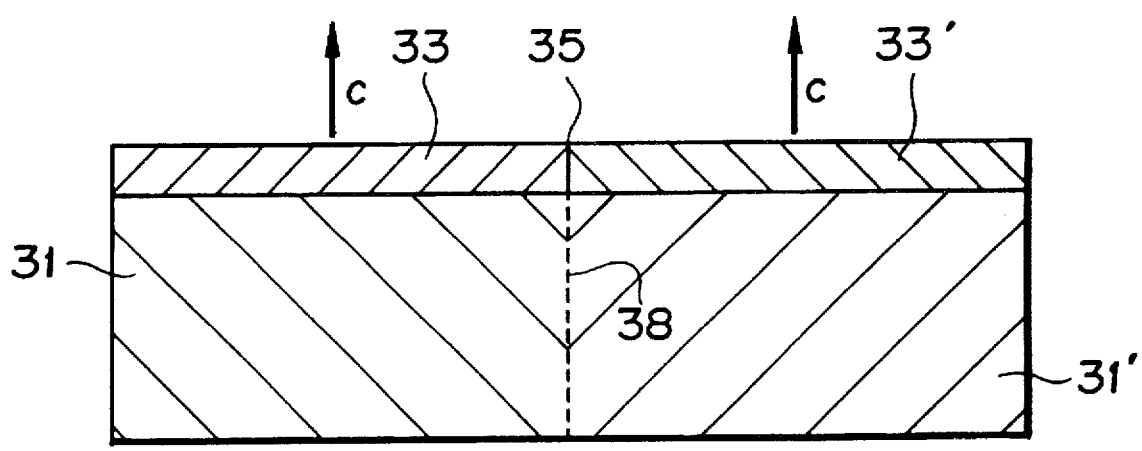
FIG. 1B is a cross sectional view showing the thin film shown in FIG. 1A.
Figure 2A:
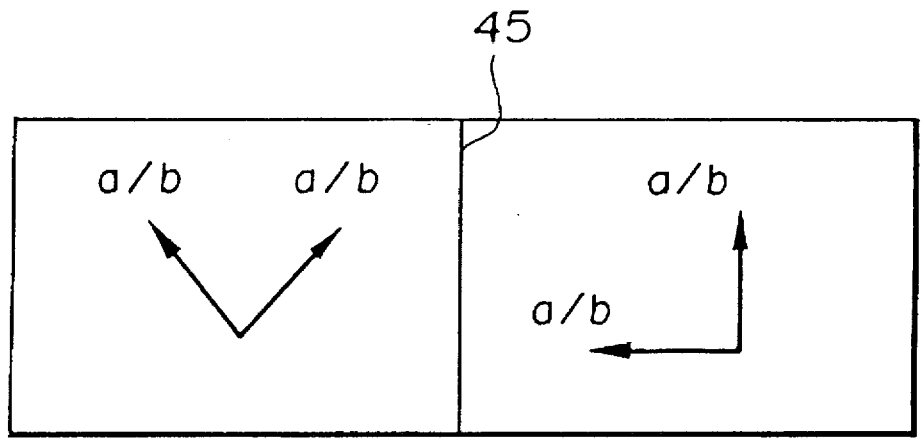
FIG. 2A is a planar view showing a conventional thin film 45°-inclined grain boundary junction.
Figure 2B:
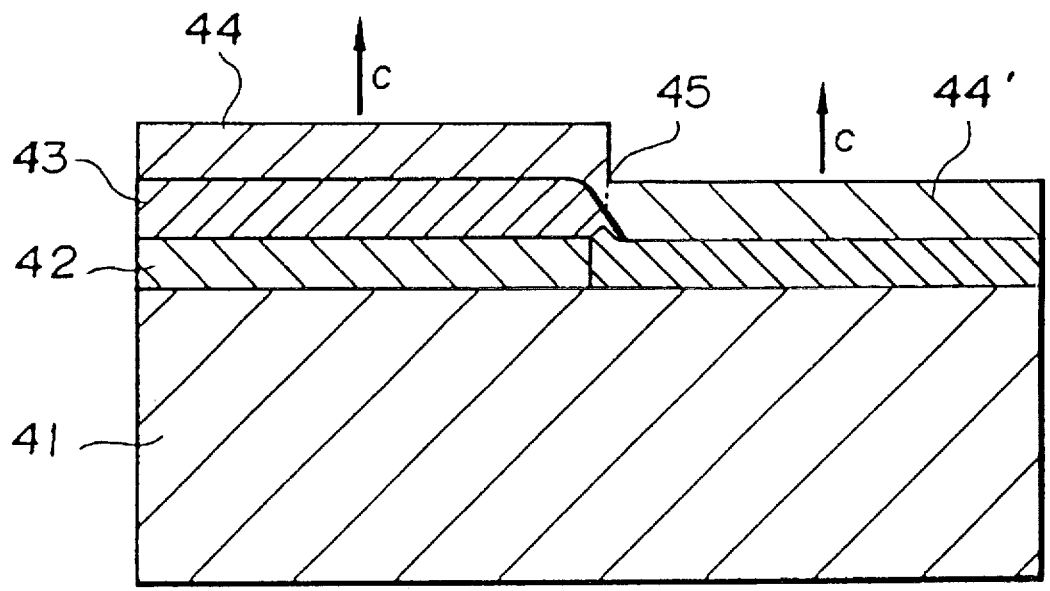
FIG. 2B is a cross sectional view showing the thin film shown in FIG. 2A.
Figure 3:
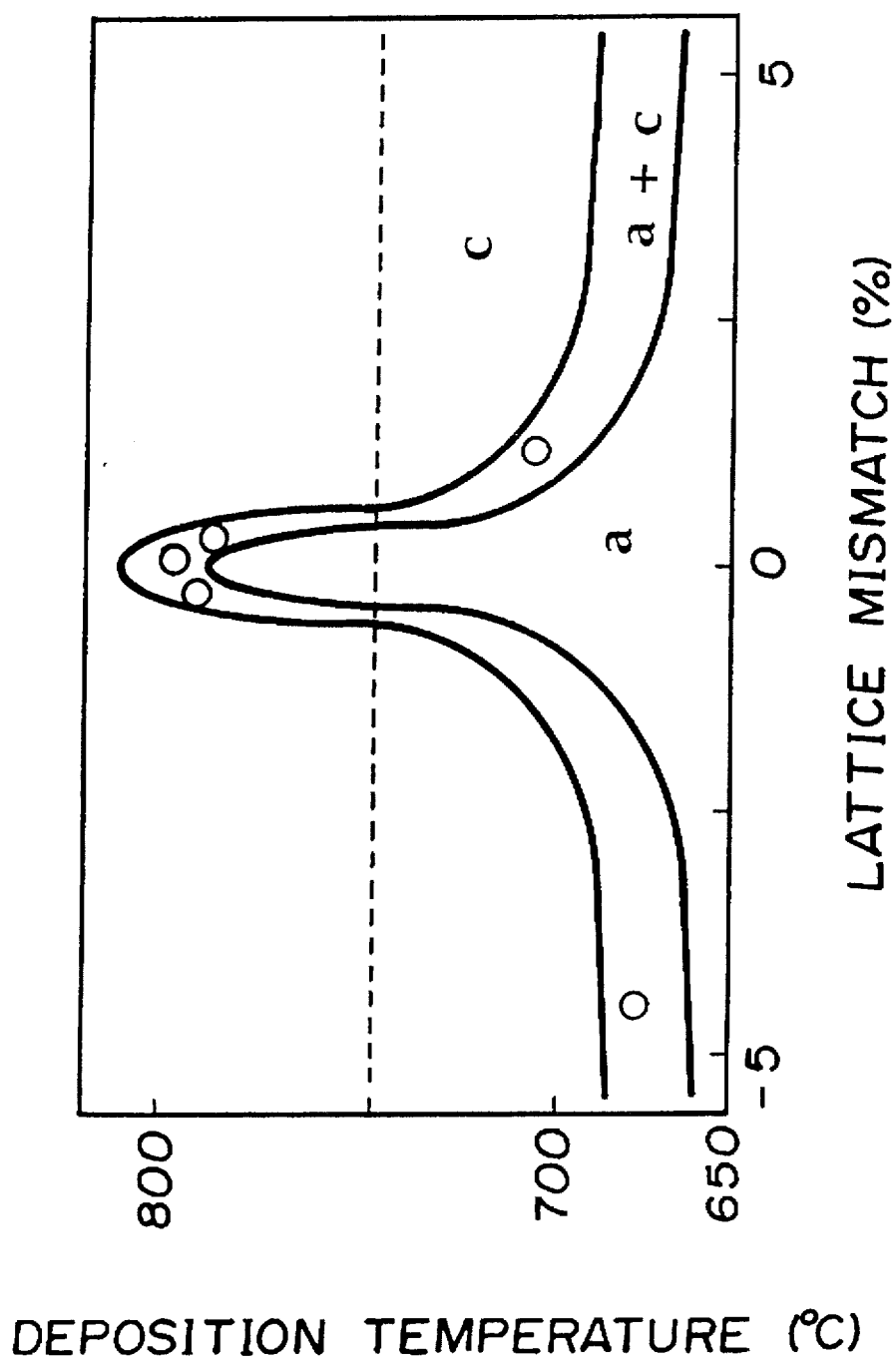
FIG. 3 is a graph illustrating the results of experiments on the relationship between the lattice mismatch and the temperature of a substrate differentiating whether or not the substrate is a-axis oriented or c-axis oriented, with a vertical axis indicating the temperature of deposition (temperature of a substrate), and the horizontal axis lattice mismatch of a thin film with a $YBa_2Cu_3O_x$ thin film.

FIG. 3 is a graph illustrating the dependence of the crystallographic axis or a thin film of a $YBa_2Cu_3O_x$ superconductor on the temperature of a substrate on which the thin film is formed when the substrate is composed of a material having a lattice mismatch differing from that of the $YBa_2Cu_3O_x$ superconductor. For example, the substrate is composed of a metal oxide such as MgO, $SrTiO_3$, $LaSrGaO_4$, $PrGaO_3$, $NdGaO_3$, $LaAlO_3$, or $YAlO_3$. As illustrated in FIG. 3, when a lattice mismatch is present a substrate temperature or deposition temperature exists at which there appear both a-axis oriented and c-axis oriented phases.

Table 1 below shows lattice constant at room temperature, lattice constants of pseudo tetragonal crystal, crystals structures, and thermal expansion coefficients of various substrates.

TABLE 1

Lattice Constant and Other Physical Properties of Various Substrates

| Material | Lattice Constant of Pseudo Tetragonal Crystal (Å) | Crystal Structure | Lattice Constant (Å) | Thermal Expansion Coefficient ($10^{-6}$/K) |
|---|---|---|---|---|
| Nd:YAlO$_3$ | 3.685 | orthogonal system | a = 5.179 b = 5.329 c = 7.370 | 5–10 |
| LaAlO$_3$ | 3.792 | rhombohedral system cubic system | a = 5.357 a = 60°6' (not lower than 450° C.) | 11 |
| SrLaGaO$_4$ | 3.842 | tetragonal system | a = 3.842 c = 12.861 | 10 |
| NdGaO$_3$ | 3.861 | orthogonal system | a = 5.428 b = 5.493 c = 7.729 | 6–12 |
| PrGaO$_3$ | 3.873 | orthogonal system | a = 5.542 b = 5.493 c = 7.740 | 7–8 |
| LaGaO$_3$ | 3.894 | orthogonal system rhombohedral system | a = 5.519 b = 5.494 c = 7.770 (not lower than 150° C.) | 10 |
| SrTiO$_3$ | 3.905 | cubic system | a = b = c = 3.905 | 10.8 |
| MgO | 4.203 | cubic system | a = b = c = 4.203 | 14 |

The substrate materials have different lattice mismatches with respect to $YBa_2Cu_3O_x$ from each other.

Note that a lattice mismatch is defined by the following equation:

$$M = \frac{(\alpha - \beta)}{\{(\alpha + \beta)/2\}}$$

wherein α is a lattice constant of one monocrystal along its a-or b-axis direction; and β is a lattice constant of the other monocrystal along its a- or b-axis direction.

In FIG. 3, symbol a designates a region where a $YBa_2Cu_3O_x$ thin film grows which has an a-axis orientation (i.e., a $CuO_2$ plane is perpendicular to a surface of the substrate); symbol c designates a region where a $YBa_2Cu_3O_x$ thin film grows which has a c-axis orientation (i.e., a $CuO_2$ plane is parallel to a surface of the substrate); and symbol (a+c) designates a region comprising a $YBa_2Cu_3O_x$ thin film in which an a-axis orientation and a c-axis orientation coexist.

FIG. 3 indicates that crystal directions (orientations) of $YBa_2Cu_3O_x$ superconducting thin films formed on substrates composed of different materials, respectively, depend on lattice mismatches with respect to the materials of the substrates even when the substrates are at the same substrate temperature. A $YBa_2Cu_3O_x$ superconducting thin film is c-axis oriented on a substrate composed of a material having a relatively large lattice mismatch with respect to the thin film while it is a-axis oriented on a substrate composed of a material having a relatively small lattice mismatch with respect to the thin film.

For example, let us consider the case where a $SrTiO_3$ substrate having a lattice mismatch with respect to $YBa_2Cu_3O_x$ of 1.1% is used and there is used $PrGaO_3$ having a lattice mismatch with respect to $YBa_2Cu_3O_x$ of 0.02% as a vapor deposition material which is locally deposited on the $SrTiO_3$ substrate. Then, if the substrate temperature is increased to 750° C. which is the vapor deposition temperature indicated by a broken line in FIG. 3, a $YBa_2Cu_3O_x$ thin film deposited on $SrTiO_3$ has a c-axis orientation (i.e., its $CuO_2$ plane is parallel to a surface of the substrate) while a $YBa_2Cu_3O_x$ thin film deposited on $PrGaO_3$ has an a-axis orientation (i.e., its $CuO_2$ plane is perpendicular to a surface of the substrate). Therefore, the $CuO_2$ plane in which current flows can be made perpendicular to a surface of the thin film to thereby reduce leakage current, which was impossible to attain conventionally.

This is also true for the case where a $YBa_2Cu_3O_x$ thin film is deposited at a deposition temperature shown in FIG. 3 on a substrate through $NdGaO_3$ (lattice mismatch with respect to $YBa_2Cu_3O_x$: 0.3%) and $SrTiO_3$ (lattice mismatch with respect to $YBa_2Cu_3O_x$: 1.1%) formed on a surface of the substrate.

Figure 4:
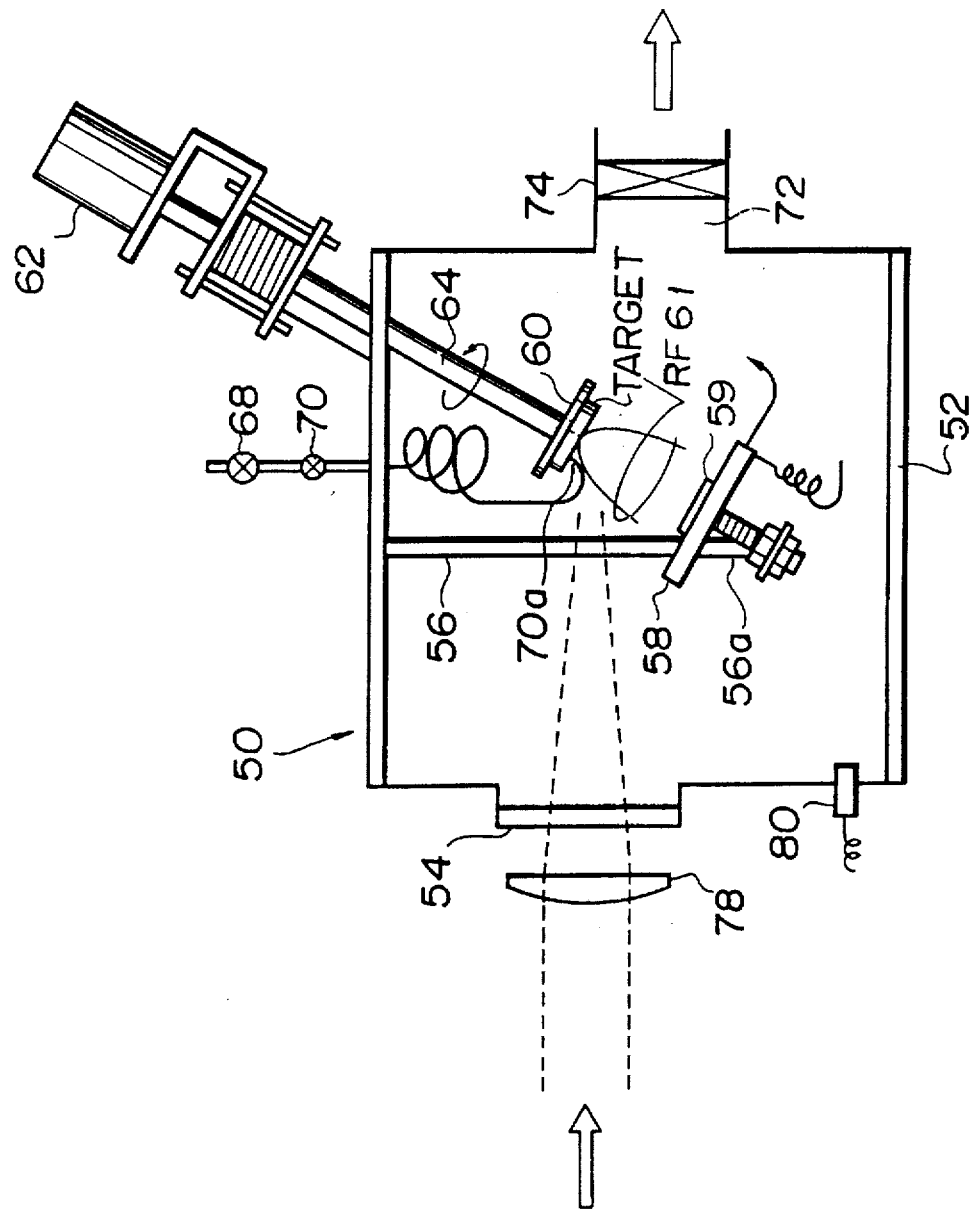
FIG. 4 is a schematic cross sectional view showing a conventional laser beam deposition equipment.

Fabrication of thin films can be performed by laser beam vapor deposition, for example, ArF excimer laser beam vapor deposition. Laser beam vapor deposition can be carried out by using a conventional laser beam vapor deposition apparatus as shown in FIG. 4. In FIG. 4, reference numeral 50 designates a laser beam vapor deposition apparatus, which is provided with a vacuum container 52 formed with an inlet window 54. Inside the vacuum container 52, there is fixed a support rod 56. To a top 56a of the support rod 56 is attached a substrate holder 58 on which a substrate 59 is mounted. Opposite to the substrate holder 58, there is arranged a target holder 60 on which a target 61 is held. A motor 62 is arranged outside the vacuum container 52. The motor 62 has a shaft 64, which is inserted into the vacuum container 52 airtightly. An end of the shaft 64 is connected to the target holder 60, and the target holder 60 is rotated by the shaft 64 driven by the motor 62. The vacuum container 52 is connected to an oxygen inlet conduit 70 which supplies oxygen to the vacuum container 52 through a leak valve 68. On the other hand, the vacuum container 52 is provided with an exhaust port 72 and a valve 74 through which the vacuum container 52 is connected to an exhaust system (not shown)

to maintain vacuum. Outside the inlet window 54, there is arranged a focusing lens 78 and a laser beam source (not shown). A laser beam from the laser beam source (not shown) passing through the focusing lens 78 and then through the inlet window 54, arrives onto a rotating target 5 driven by the shaft 64 of the motor 62 to generate plasma, and allows a thin film to deposit on an opposing substrate held on the substrate holder 58. The substrate attached to the substrate holder 58, heated by a heater (not shown), energized by a power source (not shown) for the heater to an appropriate temperature. The temperature is monitored by a thermocouple (not shown). In the presence of oxygen supplied through an oxygen inlet port 70a of the oxygen inlet conduit 70, a target component is deposited on the substrate 59. A vacuum meter 80 attached to the vacuum container 52 monitors the degree of vacuum inside the vacuum container 52 and sends a control signal to a vacuum control system (not shown) for adjusting the vacuum degree.

While the conditions for fabrication of a lattice matching device by laser beam vapor deposition varies depending on the oxygen source to be used, as the oxygen source, there can be used atomic oxygen or ozone. Generally, it is carried out at a substrate temperature of from 550° to 850° C., preferably from 600° to 750° C., at an oxygen pressure of from $1 \times 10^{-5}$ Torr to 10 Torr, preferably from 1 mTorr to 1 Torr.

For example, the substrate is composed of (100) $SrTiO_3$ having a lattice mismatch of 1.1%, a part of which is masked with MgO and an unmasked part of which is deposited with a $PrGaO_3$ thin film having a lattice mismatch of 0.02% at a substrate temperature of 750° C. and at an oxygen pressure of 50 mTorr to a thickness of 50 Å. Then, after the substrate temperature is decreased to room temperature, the mask is removed and a $YBa_2Cu_3O_x$ thin film is deposited to a thickness of 800 Å at a substrate temperature of 680° C. and at an oxygen pressure of 400 mTorr. The thin film formed can be evaluated by XRD, RHEED, φ-scan using a (102) surface, and cross section TEM.

The orientation axis length of the $YBa_2Cu_3O_x$ thin film formed is measured by X-ray diffraction (XRD) analysis using Cu-Kα. The preferential orientation axis of the $YBa_2Cu_3O_x$ is determined by the intensities obtained by XRD. That is, c-axis and a-axis orientations are assumed to be represented by the (005) peak and the (200) peak, respectively, of the $YBa_2Cu_3O_x$ as representative peaks, and when both the (005) and (200) peaks are detected by XRD, then the stronger peak is judged to be dominant, and when one of them is undetectable at all, the orientation is judged to be pure or uniform.

EXAMPLES

Hereinafter, the present invention will be described in more detail by examples. However, it should not be construed that the present invention is limited thereto.

Example 1

Figure 5A:
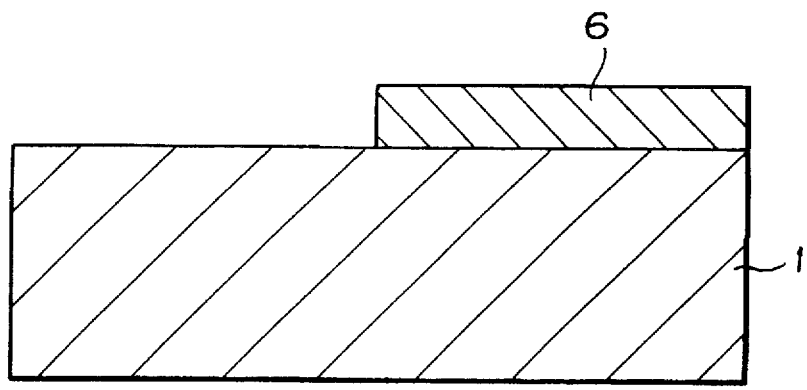
FIGS. 5A, 5B and 5C together illustrate a fabrication procedure for fabricating a grain boundary junction according to Example 1 of the present invention, with FIGS. 5A, 5B and 5C being cross sectional views, respectively, showing a grain boundary junction during a fabrication step.
Figure 5B:
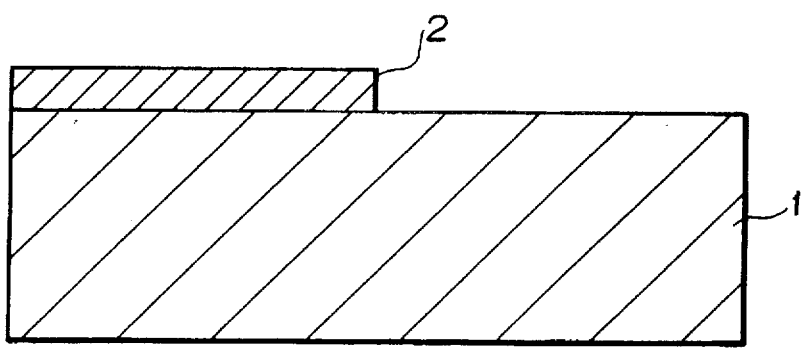
Figure 5C:
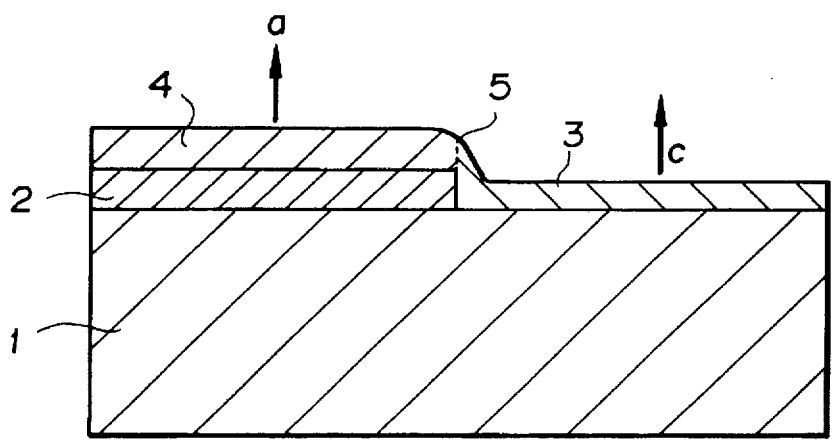

FIGS. 5A, 5B and 5C are cross sectional views illustrating fabrication of a grain boundary junction device according to a first example of the present invention. In FIGS. 5A, 5B and 5C, reference numeral 1 designates a $SrTiO_3$ substrate, 2 is a $PrGaO_3$ layer, 3 is a c-axis oriented $YBa_2Cu_3O_x$ thin film, 4 is an a-axis oriented $YBa_2Cu_3O_x$ thin film, 5 is a grain boundary junction formed between the c-axis oriented $YBa_2Cu_3O_x$ thin film 3 and the a-axis oriented $YBa_2Cu_3O_x$ thin film 4, and 6 is a mask.

FIG. 5A shows, in cross section, a $SrTiO_3$ substrate 1 having a lattice mismatch with respect to $YBa_2Cu_3O_x$ of 1.1%, for example, the substrate having thereon a mask 6. Then, $PrGaO_3$ having a lattice mismatch with respect to $YBa_2Cu_3O_x$ of 0.02% is deposited on a part of the surface of the substrate 1 which part is uncovered by the mask 6. Removal of the mask 6 gives the structure shown in FIG. 5B.

Finally, as shown in FIG. 5C, a $YBa_2Cu_3O_x$ thin film is deposited on the overall surface of the substrate shown in FIG. 5B at a substrate temperature of 750° C which is shown in broken line in FIG. 3. As shown in FIG. 5C, this results in the formation of a c-axis oriented $YBa_2Cu_3O_x$ thin film 3 on the $SrTiO_3$ substrate 1 and an a-axis oriented $YBa_2Cu_3O_x$ thin film 4 on the $PrGaO_3$ layer 2, and a grain boundary junction 5 is formed in a boundary region between the c-axis oriented $YBa_2Cu_3O_x$ thin film 3 and the a-axis oriented $YBa_2Cu_3O_x$ thin film 4. The grain boundary junction 5 is a grain boundary junction of c-axis orientation/a-axis orientation in which a $CuO_2$ plane, that allows current to pass therein, crosses the boundary portion between both $YBa_2Cu_3O_x$ thin films at right angles.

In this example, although an explanation has been made with respect to the case where $SrTiO_3$ (lattice mismatch: 1.1%) and $PrGaO_3$ (lattice mismatch: 0.02%) are employed, it is sufficient to choose a material having a lattice mismatch exceeding 1% (for example, MgO, $SrTiO_3$, $LaAlO_3$, $YAlO_3$, etc.) and another material having a lattice mismatch not exceeding 1% (for example, $PrGaO_3$, $NdGaO_3$, $LaSrGaO_4$, etc.) since the curve illustrated in FIG. 3 has inflection points near ±1%. While the explanation has been made using $YBa_2Cu_3O_x$, $LnBa_2Cu_3O_x$ may also be used so far as it is a material which exhibits superconductivity.

Example 2

Figure 6A:
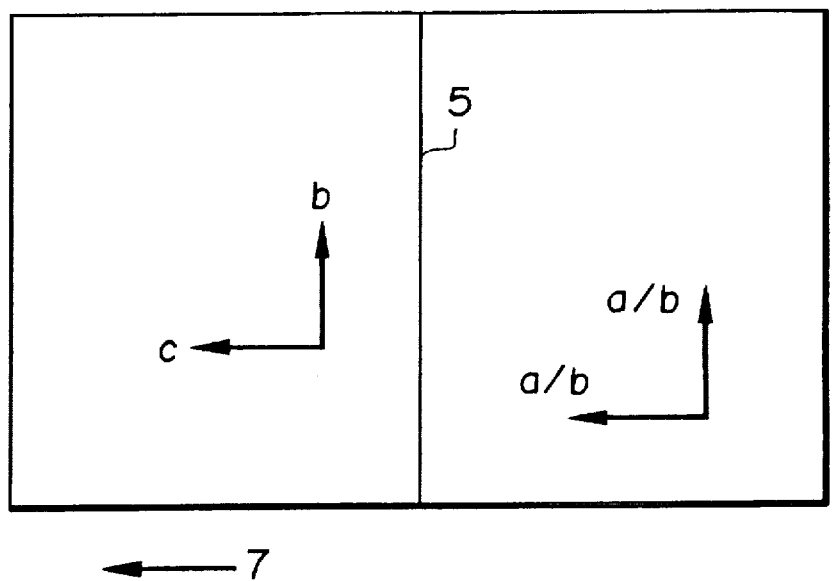
FIG. 6A is a planar view showing a grain boundary junction according to Example 2 of the present invention.
Figure 6B:
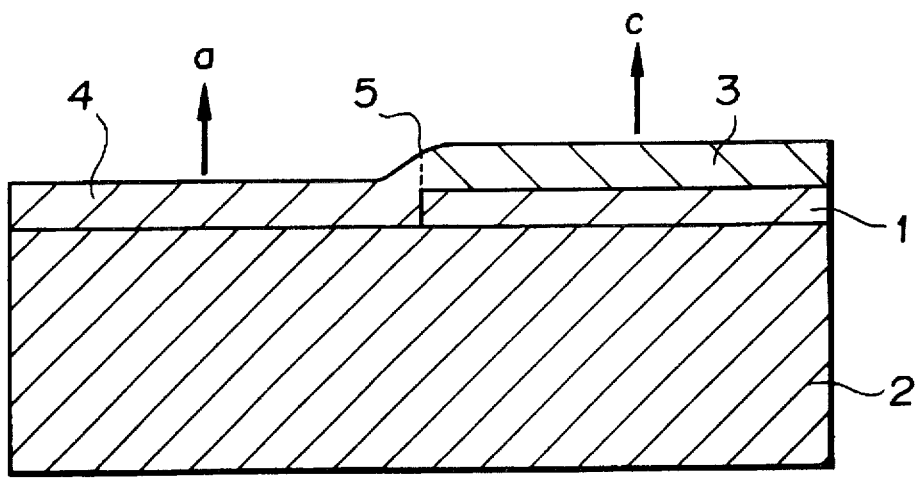
FIG. 6B is a cross sectional view showing a grain boundary junction according to Example 2 of the present invention.

Referring to FIGS. 6A and 6B, a grain boundary junction according to a second example of the present invention will be described below. This example uses a (110) $PrGaO_3$ substrate and a $SrTiO_3$ deposition material. FIG. 6A is a planar view showing a grain boundary junction according to this example, and FIG. 6B is a cross sectional view of the grain boundary junction shown in FIG. 6A. In FIG. 6B, reference numeral 2 designates a (110) $PrGaO_3$ substrate, 1 is $SrTiO_3$ layer deposited on the substrate 2, 3 is a c-axis oriented $YBa_2Cu_3O_x$ thin film, 4 is an a-axis oriented $YBa_2Cu_3O_x$ thin film, 5 is a grain boundary junction formed between the c-axis oriented $YBa_2Cu_3O_x$ thin film 3 and the a-axis oriented $YBa_2Cu_3O_x$ thin film 4, and 7 is an arrow indicating the direction the of the longer axis in an in-plane lattice of the substrate.

Fabrication of the grain boundary junction device of this example is conducted in substantially the same manner as in Example 1 illustrated in FIGS. 5A to 5C except that a portion designed to be a-axis oriented must be masked. When a material whose in-plane lattice is not square, such as (110) $PrGaO_3$, (110) $NdGaO_3$, or (100) $LaSrGaO_4$, is used for a substrate, the resulting a-axis oriented $YBa_2Cu_3O_x$ thin film has a c-axis which is parallel to a surface of the substrate is which in its nature in the direction of the longer axis of the in-plane lattice of the substrate. For example, when the direction of the longer axis of the in-plane lattice indicated by the arrow 7 is perpendicular to the grain boundary junction, as shown in FIG. 6A, the junction plane is defined between an a-/b-axis oriented $YBa_2Cu_3O_x$ thin film (formed on the $SrTiO_3$ layer) and a c-axis oriented $YBa_2Cu_3O_x$ thin film (formed on the $PrGaO_3$ substrate). On the contrary, when the longer axis direction of the in-plane lattice of the substrate indicated by the arrow 7 is parallel to the grain boundary junction, a junction is formed which has a junction plane defined between an a-/b-axis oriented $YBa_2Cu_3O_x$ thin film (formed on the $SrTiO_3$ layer) and a b-axis oriented $YBa_2Cu_3O_x$ thin film (formed on the $PrGaO_3$ substrate), which plane is perpendicular to a $CuO_2$ plane, that allows current to flow therein. As stated above, the junction plane of a grain boundary junction can be controlled by selecting the orientation of the crystal of the substrate.

In FIG. 3, the junction is fabricated on only one side of the original substrate. However, an unmasked portion may be formed in the form of a rectangle on the substrate so that a plurality of junctions can be fabricated. In that case, a junction between an a-/b-axis oriented thin film and a c-axis oriented thin film is fabricated on one side of the rectangle and a junction between an a-/b-axis oriented thin film and a b-axis oriented thin film is fabricated on another side of the rectangle, thus giving rise to a junction having opposing electrodes one of which is constituted by an a-axis oriented thin film and the other is constituted by a c-axis oriented thin film so that a $CuO_2$ plane in which current flows can be perpendicular to a surface of the substrate. Thus, different types of junctions can be fabricated at will by selecting preferential orientation of the substrate.

Example 3

Figure 7:
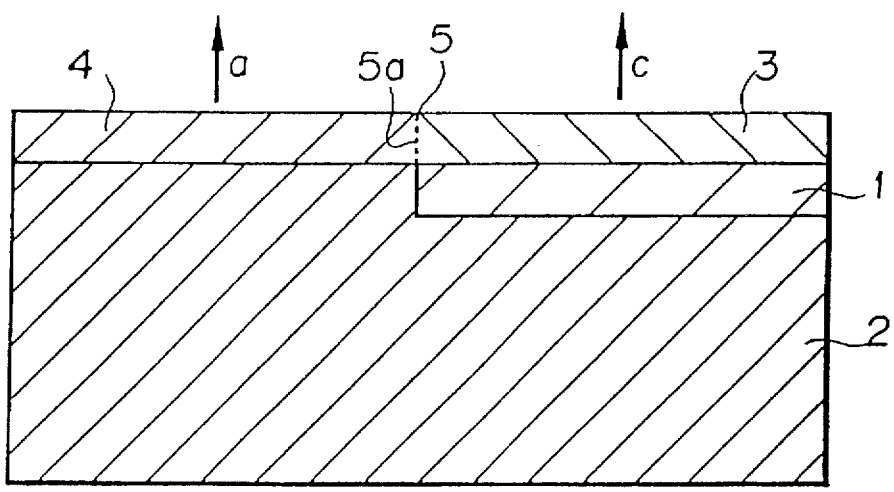
FIG. 7 is a cross sectional view showing a grain boundary junction according to Example 3 of the present invention.

FIG. 7 is a cross sectional view showing a grain boundary junction according to a third example of the present invention. In FIG. 7, reference numeral 1 designates a $SrTiO_3$ layer, 2 is a (110) $PrGaO_3$ substrate, 3 is a c-axis oriented $YBa_2Cu_3O_x$ thin film, 4 is an a-axis oriented $YBa_2Cu_3O_x$ thin film, and 5 is a grain boundary junction. The grain boundary junction device according to this example is fabricated in the same manner as the grain boundary junction device shown in FIG. 6B except that after a mask is provided on the substrate as shown in FIGS. 5A, the substrate is etched to some depth, and $SrTiO_3$ is deposited on the etched portion to form a $SrTiO_3$ layer 1 to make up the hollow portion or provide an even or leveled surface. The leveling is advantageous in that there can be obtained a junction having a uniform junction plane 5a free of an irregular crystal orientation.

In this example, while one of monocrystal regions having different lattice mismatches is formed by deposition of a thin film and the substrate is used as the other region, both regions may be formed by deposition of thin films. In that case, less expensive substrates may be used.

Example 4

Figure 8:
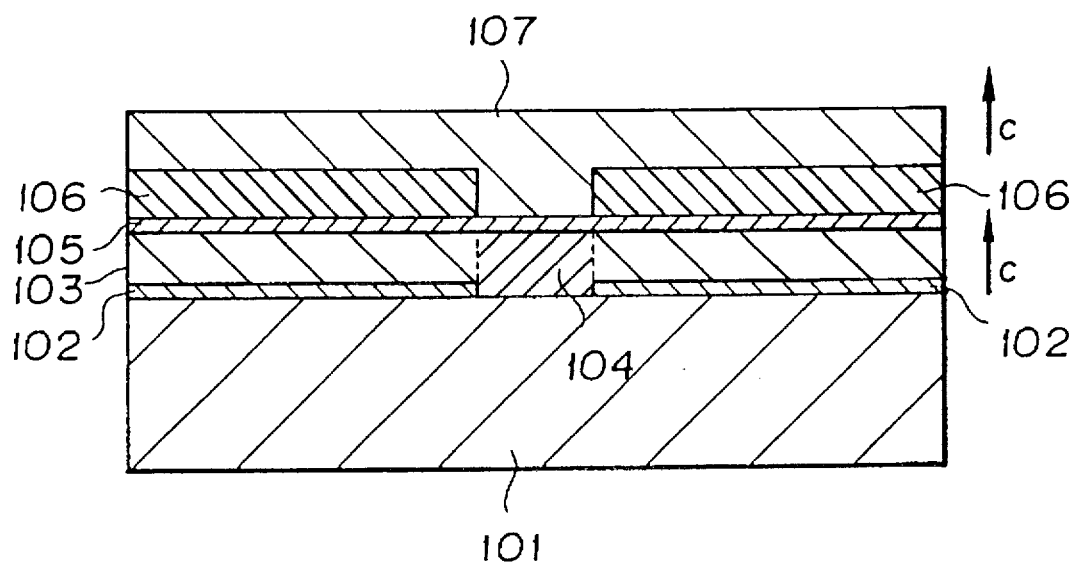
FIG. 8 is a schematical cross sectional view showing a superconducting vertical junction device according to Example 4 of the present invention.

FIG. 8 is a cross sectional view showing a superconducting vertical junction according to a fourth example of the present invention. In FIG. 8, reference numeral 101 is a $NdGaO_3$ substrate, 102 is a $SrTiO_3$ thin film, 103 is a lower electrode composed of a c-axis oriented $YBa_2Cu_3O_x$ thin film, and serving as a superconducting wiring 104 is a lower electrode composed of an a-axis oriented $YBa_2Cu_3O_x$ thin film, 105 is a barrier layer composed of a $SrTiO_3$ thin film, 106 is a $SrTiO_3$ interlayer insulator, and 107 is an upper electrode composed of a c-axis oriented $YBa_2Cu_3O_x$ thin film. As shown in FIG. 8, the junction portion is comprised by the upper electrode 107, the barrier layer 105 and the lower electrode 104 which constitute a superconductor/insulator/superconductor structure (SIS structure). Here, the superconducting wiring 103 is composed of a c-axis oriented thin film (i.e., a thin film whose c-axis in the direction of a smaller coherence length is perpendicular to a surface of the substrate) and the lower electrode 104 is composed of an a-axis oriented thin film (i.e., a thin film whose c-axis in the direction of a smaller coherence length is in a plane parallel to a surface of the substrate). To operate this device, current is applied through the superconducting wiring 103 to the lower electrode 104, the barrier layer 105 and the upper electrode 107. On this occasion, current flows more easily in the superconducting wiring 103 while in the lower electrode 104, current flows more easily in a direction perpendicular to the plane parallel to a surface of the substrate. This is an important feature of the device according to this example of the present invention.

Figure 9A:
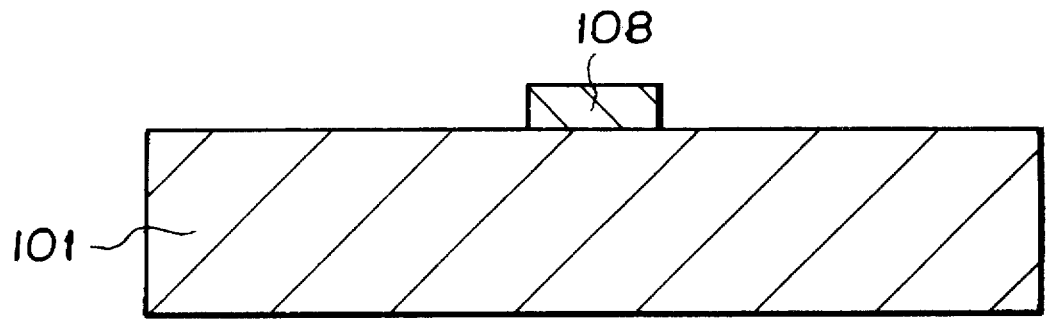
FIGS. 9A through 9D together illustrate a fabrication procedure for fabricating a superconducting vertical junction device according to Example 4 of the present invention, with FIGS. 9A, 9B, 9C and 9D being cross sectional views, respectively, showing a superconducting vertical junction device during a fabrication step.
Figure 9B:
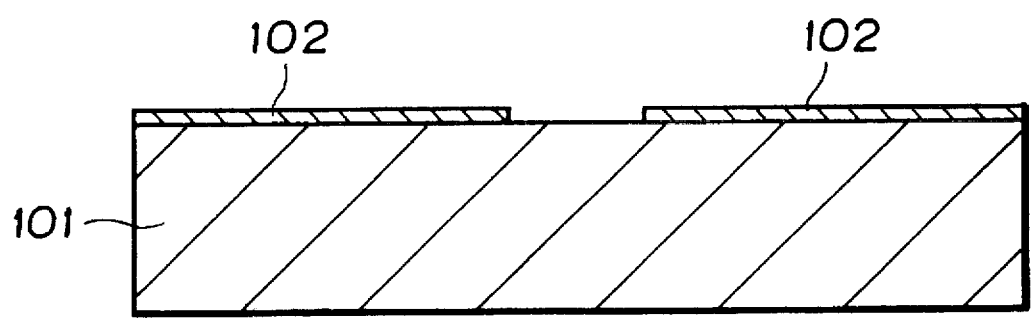

Next, fabrication of the device according to this example of the present invention will be explained referring to FIGS. 9A through 9D, in which reference numerals 101 to 107 designate the same or like parts or members shown in FIG. 8, and 108 is a mask. FIG. 9A illustrates a state in which a mask 108 is formed on, for example, a $NdGaO_3$ substrate 101 having a lattice mismatch with respect to $YBa_2Cu_3O_x$ of 0.3%. Then, for example, a $SrTiO_3$ layer 102 having a lattice mismatch with respect to $YBa_2Cu_3O_x$ of 1.1% is deposited on a portion other than that covered with the mask 108. After the deposition, the mask 108 is removed. FIG. 9B shows an arrangement in which the mask 108 has been removed after the deposition of the $SrTiO_3$ layer 102.

Figure 9C:
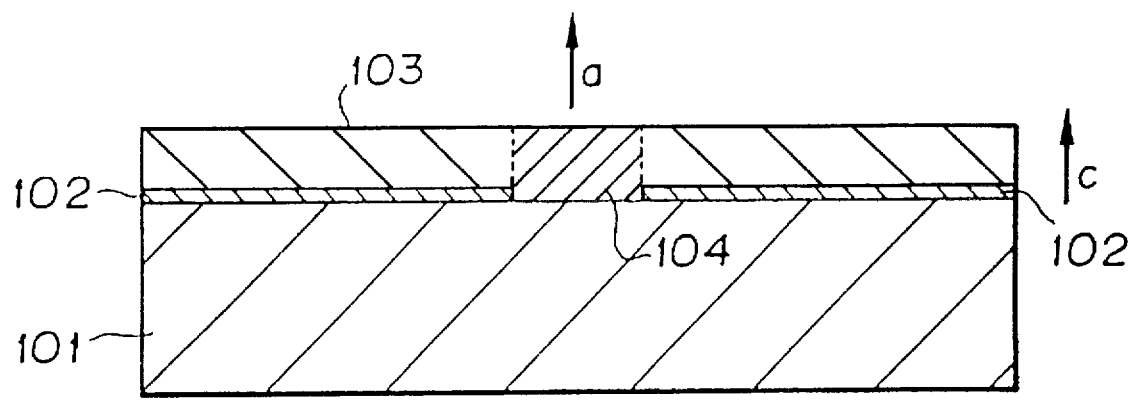
Figure 9D:
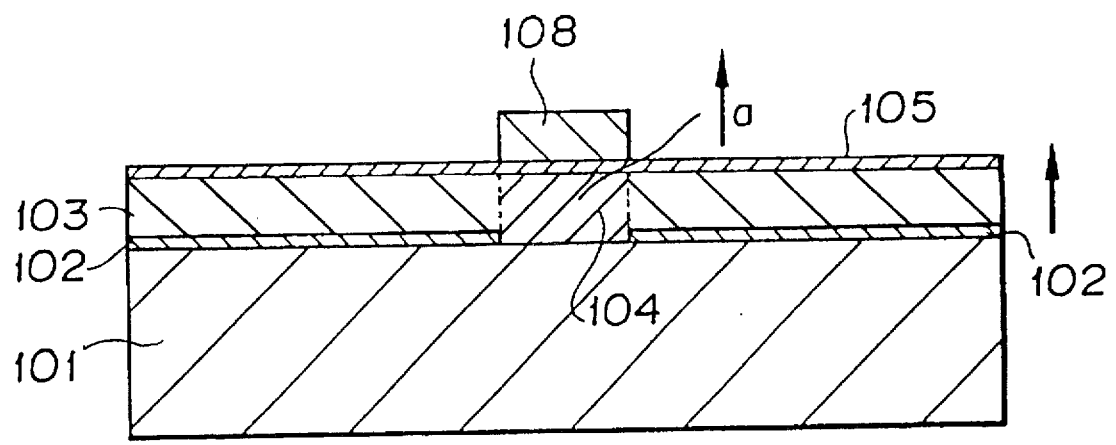

On the overall surface of the substrate, there is deposited a $YBa_2Cu_3O_x$ thin film at a substrate temperature of 750° C. for example, which is shown by the broken line in FIG. 3. As a result, a c-axis oriented $YBa_2Cu_3O_x$ thin film 103 is deposited on the $SrTiO_3$ thin film 102 and an a-axis oriented $YBa_2Cu_3O_x$ thin film 104 is deposited on the $NdGaO_3$ substrate 101, as shown in FIG. 9C. On the overall surface of the resulting structure, there is deposited a $SrTiO_3$ ultra thin film 105 serving as a barrier layer, followed by depositing a mask 108 on the a-axis oriented $YBa_2Cu_3O_x$ thin film 104 which constitutes a superconducting junction to obtain a structure as shown in FIG. 9D. Then, a $SrTiO_3$ interlayer insulator 106 is deposited on the surface of the structure shown in FIG. 9D, and after the mask 108 is removed, an upper electrode 107 is deposited to obtain the arrangement shown in FIG. 8. By the procedure described above, there can be realized the c-axis oriented thin film 103 having the a-axis oriented lower electrode 104 only on the junction portion. While an explanation has been made hereinabove on the case where a c-axis oriented thin film is used as the upper electrode, there may be used those thin films oriented in directions other than the direction of the c-axis (such as <103>, <110>, <100>, etc.). Needless to say, the effect of the present invention can be obtained if an a-axis oriented lower electrode exists only on the junction portion.

Example 5

Figure 10:
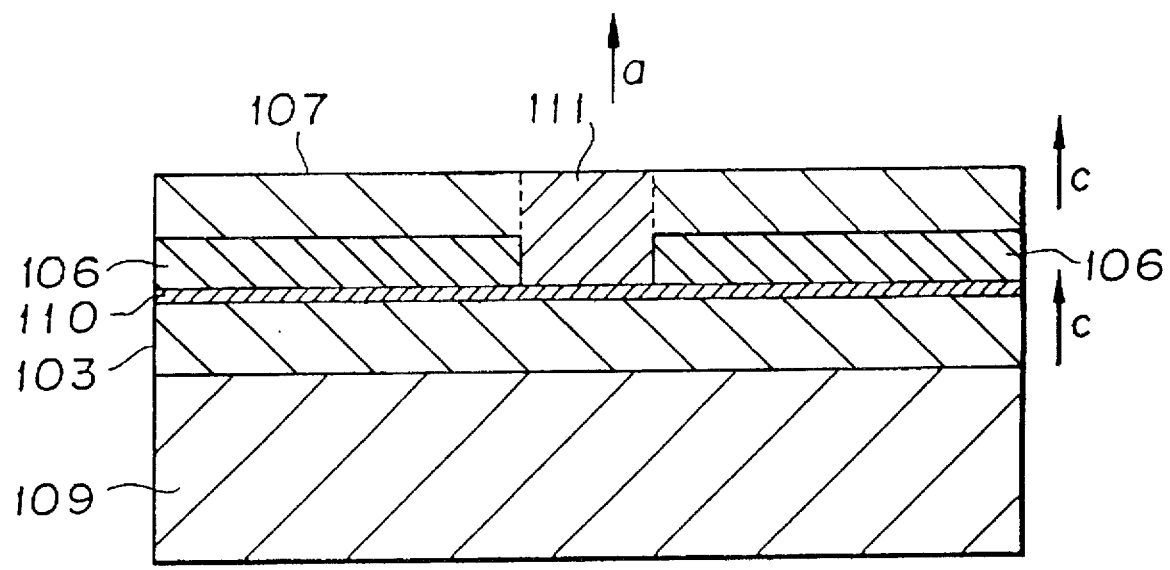
FIG. 10 is a schematical cross sectional view showing a superconducting vertical junction device according to Example 5 of the present invention.

FIG. 10 is a cross sectional view showing a superconducting vertical junction according to a fifth example of the present invention. In FIG. 10, reference numeral 103 designates a lower electrode composed of a c-axis oriented $YBa_2Cu_3O_x$ thin film, 106 is a $SrTiO_3$ interlayer insulator, 107 is an upper electrode composed of a c-axis oriented $YBa_2Cu_3O_x$ thin film, and serving as a superconducting wiring; 109 is a $SrTiO_3$ substrate, 110 is a $NdGaO_3$ barrier layer thin film, and 111 is an upper electrode composed of an a-axis oriented $YBa_2Cu_3O_x$ thin film. As shown in FIG. 10, the lower electrode 103, the barrier layer 110 and the upper electrode 111 constitute a superconductor/insulator/ superconductor structure (SIS structure). Here, the superconducting wiring 107 is composed of a c-axis oriented thin film (i.e., a thin film whose c-axis in the direction of a smaller coherence length is perpendicular to a surface of the substrate) and the upper electrode 111 is composed of an a-axis oriented thin film (i.e., a thin film whose c-axis in the direction of a smaller coherence length is in a plane parallel to a surface of the substrate). To operate this device, current is applied through the superconducting wiring 107 to the upper electrode 111, the barrier layer 110 and the lower electrode 103 which constitute the junction portion. On this occasion, current flows more easily in a plane parallel to a surface of the substrate in the superconducting wiring 107 while in the upper electrode 111, current flows more easily in a direction perpendicular to the plane parallel to a surface of the substrate. This is an important feature of the device according to this example of the present invention.

Figure 11A:
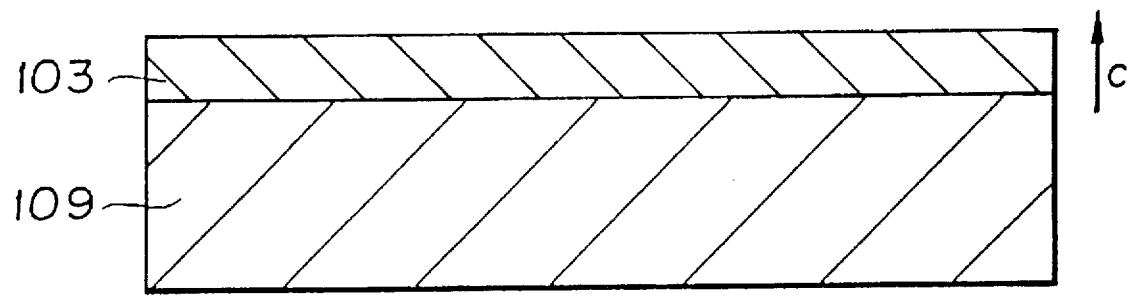
FIGS. 11A and 11B together illustrate a fabrication procedure for fabricating a superconducting vertical junction device according to Example 4 of the present invention, with FIGS. 11A and 11B being cross sectional views, respectively, showing a superconducting vertical junction device during a fabrication step.
Figure 11B:
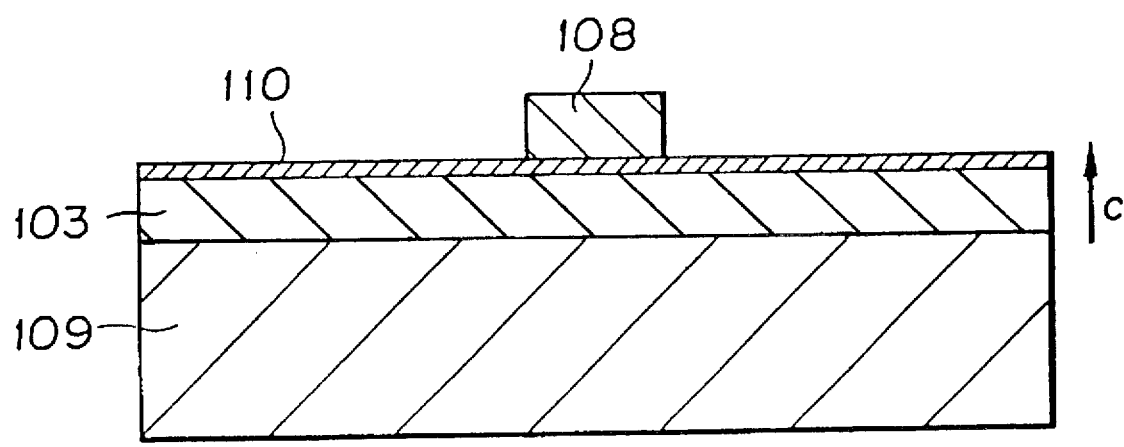

Next, fabrication of the device according to this example of the present invention will be explained referring to FIGS. 11A and 11B, in which reference numerals 103, 109 and 110 designate the same or like parts or members shown in FIG. 10, and 108 is a mask. FIG. 11A illustrates a state in which a YBa$_2$Cu$_3$O$_x$ thin film 103 is deposited on the overall surface of a SrTiO$_3$ substrate 109. Next, on the overall surface of the structure shown in FIG. 11A, there is deposited an ultra thin film 110 of NdGaO$_3$ which serves as a barrier layer, followed by covering a surface of the layer 110 to obtain a structure shown in FIG. 11B. After a SrTiO$_3$ thin film 106 serving as an interlayer insulator is deposited and the mask 108 is removed, a YBa$_2$Cu$_3$O$_x$ thin film is deposited on the overall surface of the resulting structure at a substrate temperature of 750° C. for example, which is shown by a broken line in FIG. 3. As a result, a c-axis oriented YBa$_2$Cu$_3$O$_x$ thin film 107 is deposited on the SrTiO$_3$ thin film 106 and an a-axis oriented YBa$_2$Cu$_3$O$_x$ thin film 111 is deposited on the NdGaO$_3$ substrate 101, as shown in FIG. 10. By the procedure described above, there can be realized the a-axis oriented upper electrode 111 only on the barrier layer 110 which constitutes the junction portion.

While an explanation has been made hereinabove on the case where a c-axis oriented thin film is used for the lower electrode, there may also be used those thin films oriented in directions other than the direction of the c-axis (such as <103>, <110>, <100>, etc.). Needless to say, the effect of the present invention can be obtained if an a-axis oriented upper electrode exists only on the junction portion.

Example 6

Figure 12:
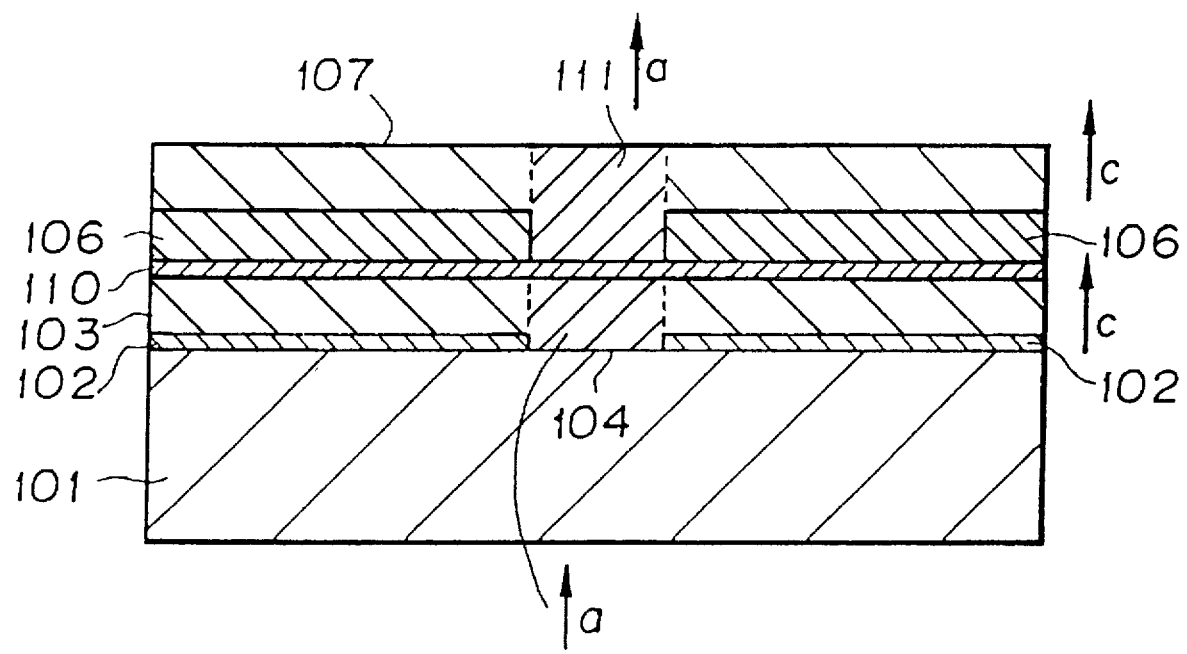
FIG. 12 is a schematical cross sectional view showing a superconducting vertical junction device according to Example 6 of the present invention.

FIG. 12 is a cross sectional view showing a superconducting vertical junction according to a sixth example of the present invention. In FIG. 12, reference numeral 101 is a NdGaO$_3$ substrate, 102 is a SrTiO$_3$ thin film, 103 is a lower electrode composed of a c-axis oriented YBa$_2$Cu$_3$O$_x$ thin film, film which serves as superconducting wiring 104 is a lower electrode composed of an a-axis oriented YBa$_2$Cu$_3$O$_x$ thin film, 106 is a SrTiO$_3$ interlayer insulator, 107 is an upper electrode composed of a c-axis oriented YBa$_2$Cu$_3$O$_x$ thin film, film which serves as superconducting wiring 110 is a NdGaO$_3$ barrier layer thin film, and 111 is an upper electrode composed of an a-axis oriented YBa$_2$Cu$_3$O$_x$ thin film which serves as superconducting wiring. As shown in FIG. 12, the lower electrode 104, the barrier layer 110 and the upper electrode 111 constitute a superconductor/insulator/superconductor structure (SIS structure). Here, the superconducting wiring 103 is composed of a c-axis oriented thin film (i.e., a thin film whose direction of a smaller coherence length is perpendicular to a surface of the substrate), the lower electrode 104 is composed of an a-axis oriented thin film (i.e., a thin film whose direction of a smaller coherence length is in a plane parallel to a surface of the substrate), the superconducting wiring 107 is c-axis oriented (i.e., a direction in which current flows more easily is parallel to a surface of the substrate), and the upper electrode 111 is an a-axis oriented (i.e., the direction in which current flows more easily is perpendicular to a surface of the substrate). To operate this device, current is applied through the superconducting wiring 107 to the upper electrode 111, the barrier layer 110, the lower electrode 104 and the superconducting wiring 103 which constitute the junction portion. On this occasion, current flows more easily in plane parallel to a surface of the substrate in the superconducting wiring 103 and while in the electrodes 104 and 111, current flows more easily in a direction perpendicular to the plane parallel to a surface of the substrate. This is an important feature of the device according to this example of the present invention.

Figure 13A:
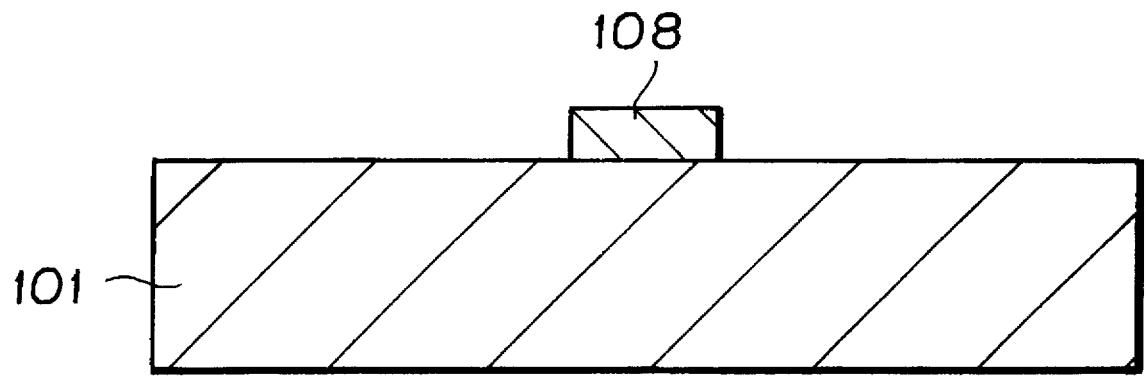
FIGS. 13A through 13D together illustrate a fabrication procedure for fabricating a superconducting vertical junction device according to Example 5 of the present invention, with FIGS. 13A, 13B, 13C and 13D being cross sectional views, respectively, showing a superconducting vertical junction device during a fabrication step.
Figure 13B:
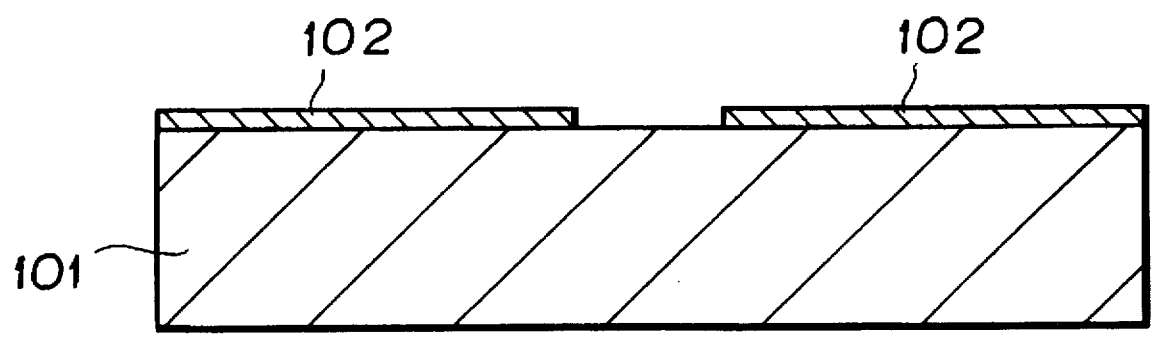

Next, fabrication of the device according to this example of the present invention will be explained referring to FIGS. 13A through 13D, in which reference numerals 101 to 104, designate the same or like parts or members shown in FIG. 12, and 108 is a mask. FIG. 13A illustrates a state in which a mask 108 is formed on, for example, a NdGaO$_3$ substrate 101 having a lattice mismatch with respect to YBa$_2$Cu$_3$O$_x$ of 0.3%. Then, for example, a SrTiO$_3$ layer 102 having a lattice mismatch with respect to YBa$_2$Cu$_3$O$_x$ of 1.1% is deposited on a portion other than that covered with the mask 108. After the deposition, the mask 108 is removed. FIG. 13B shows an arrangement in which the mask 108 has been removed after the deposition of the SrTiO$_3$ layer 102.

Figure 13C:
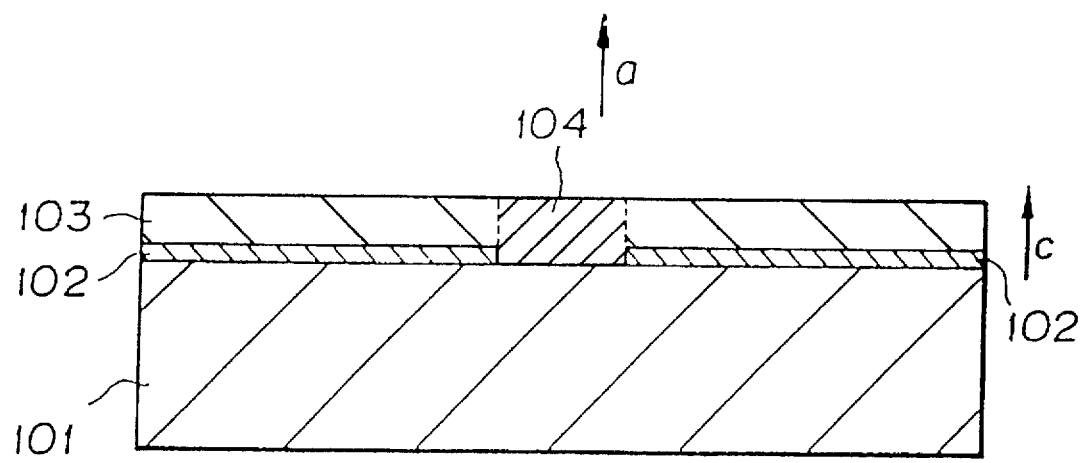
Figure 13D:
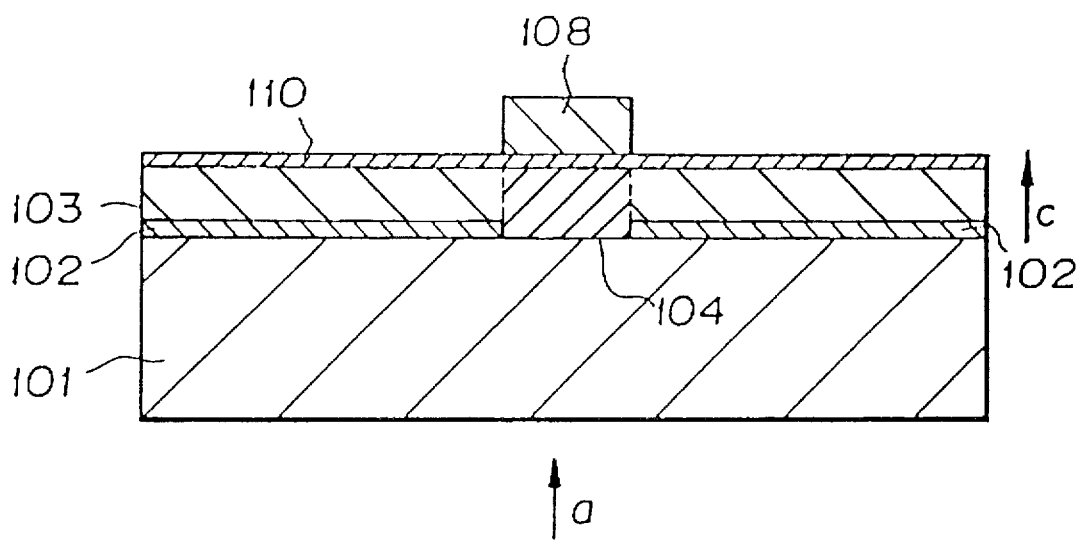

On the overall surface of the NdGaO$_3$ substrate 101 shown in FIG. 13B, there is deposited a YBa$_2$Cu$_3$O$_x$ thin film at a substrate temperature of 750° C. for example, which is shown the broken line in FIG. 3. As a result, as shown in FIG. 13C, a c-axis oriented YBa$_2$Cu$_3$O$_x$ thin film 103 is deposited on the SrTiO$_3$ thin film 102 and an a-axis oriented YBa$_2$Cu$_3$O$_x$ thin film 104 is deposited on the NdGaO$_3$ substrate 101. On the overall surface of the resulting structure, there is deposited a NdGaO$_3$ ultra thin film 110 serving as a barrier layer, followed by covering a mask 108 on a portion which is designed to be a junction to obtain a structure as shown in FIG. 13D. Then, an interlayer insulator 106 composed of a SrTiO$_3$ thin film is formed by deposition, the mask 108 is removed, and a YBa$_2$Cu$_3$O$_x$ thin film is deposited at a substrate temperature of, for example, 750° C. which is indicated by the broken line in FIG. 3 on the overall surface to obtain a structure as shown in FIG. 12. By the procedure described above, a c-axis oriented YBa$_2$Cu$_3$O$_x$ thin film 107 is deposited on the SrTiO$_3$ thin film 106 while an a-axis oriented YBa$_2$Cu$_3$O$_x$ thin film 111 is deposited on the NdGaO$_3$ substrate 101. As a result, a junction is realized in which only the junction electrodes 111 and 104 which sandwich the barrier layer 110 constituting the junction are a-axis oriented, with wiring portions other than the junction portion being c-axis oriented.

Example 7

Figure 14:
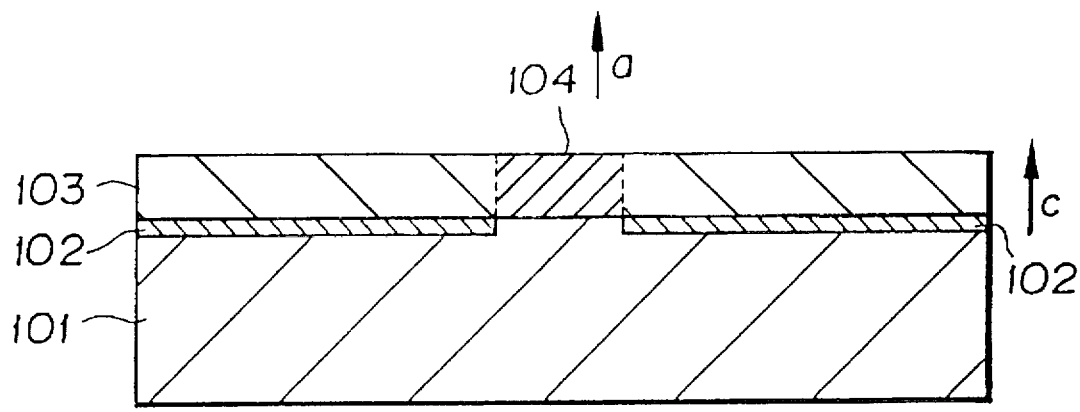
FIG. 14 is a schematical cross sectional view showing a superconducting vertical junction device according to Example 7 of the present invention.

FIG. 14 is a cross sectional view showing a superconducting vertical junction according to a seventh example of the present invention. In FIG. 14, reference numeral 101 designates a NdGaO$_3$ substrate, 102 is a SrTiO$_3$ thin film, 103 is a lower electrode composed of a c-axis oriented YBa$_2$Cu$_3$O$_x$ thin film, and 104 is a lower electrode composed of an a-axis oriented YBa$_2$Cu$_3$O$_x$ thin film. Here, an upper electrode is not shown and an explanation thereof is omitted. This example differs from Examples 1 and 3 in that in this example, before the $SrTiO_3$ thin film 102 is deposited on the substrate 101, the substrate 101 is etched to a depth equal to the thickness of the thin film 102 to be deposited subsequently using a mask 108 to protect a portion on which a junction is designed to be formed. This increases the contact area in which an a-axis oriented portion constituting the junction and a c-axis oriented portion constituting a wiring contact each other, i.e., current density, and additionally achieves leveling which increases the process margin.

While an explanation has been made hereinabove of the case where a lower electrode is embedded, the embedding of the interlayer insulator immediately below the upper electrode as described in Examples 5 and 6 above increases the contact area in the boundary region at which an a-axis oriented portion constituting a junction of the upper electrode and a c-axis oriented portion constituting a wiring.

While an explanation has been made in Examples 4 to 7 on the use of $SrTiO_3$ (lattice mismatch: 1.1%), $NdGaO_3$ (lattice mismatch: 0.3%), $YBa_2Cu_3O_x$ as a superconducting material thin film in Examples 4 to 7, it is obvious to one skilled in the art that the same effects can be obtained so far as a deposition temperature is set up at which temperature a superconducting thin film deposited on two different materials having different lattice mismatches one from another is a-axis oriented on one of the materials which has a smaller lattice mismatch and c-axis oriented on the other of the materials, i.e., the material having a larger lattice mismatch. In this example, the substrate itself and a thin film are used as materials on whose surfaces a lower electrode is to be deposited. However, needless to say, the same or similar effects can be obtained with two or more thin film materials having different lattice mismatches deposited on the substrate in the same manner as the substrate surfaces prior to the deposition of the upper electrode as described in Examples 5 and 6 (FIG. 9C and FIG. 13C, respectively).

Example 8

Figure 15:
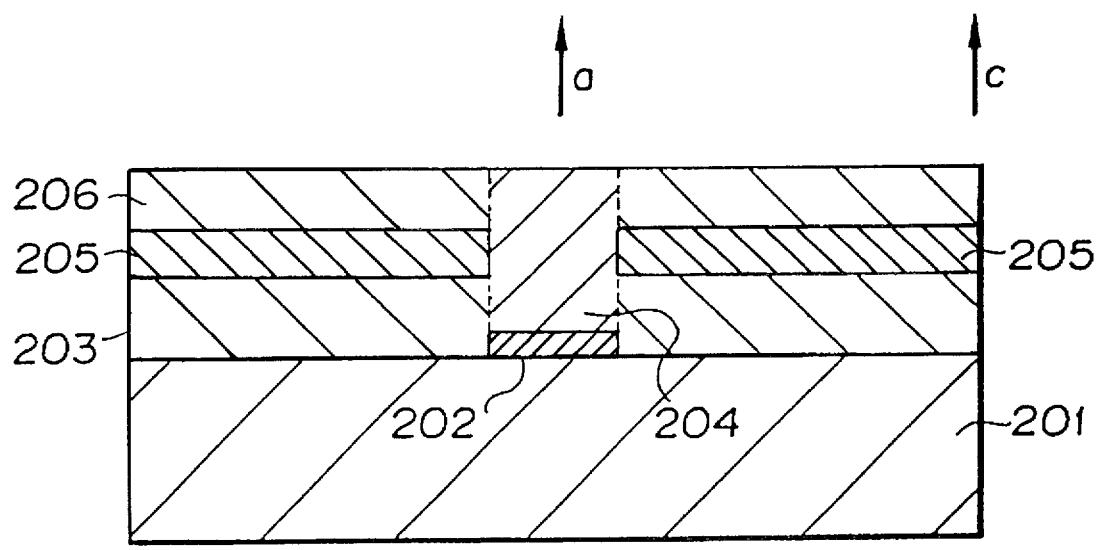
FIG. 15 is a schematical cross sectional view showing a superconducting vertical junction device according to Example 8 of the present invention.

FIG. 15 is a cross sectional view showing a superconducting vertical junction according to an eighth example of the present invention. In FIG. 15, reference numeral 201 is a $SrTiO_3$ substrate, 202 is a $NdGaO_3$ thin film, 203 is a c-axis oriented $YBa_2Cu_3O_x$ thin film a forming a portion of a lower integrated circuit, 204 is an a-axis oriented $YBa_2Cu_3O_x$ thin film serving as an interlayer wiring, 205 is a $SrTiO_3$ interlayer insulator, and 206 is a c-axis oriented $YBa_2Cu_3O_x$ thin film forming a portion of an upper integrated circuit. Here, the thin film in the integrated circuit is composed of a c-axis oriented thin film (direction of a smaller coherence length is perpendicular to a surface of the substrate), and the interlayer wiring 204 is composed of an a-axis oriented thin film (direction of a smaller coherence length is parallel to a surface of the substrate). Current which flows through the interlayer wiring transmits through the thin film 203 in the lower integrated circuit to the interlayer wiring 204 and then to the thin film 206 in the upper integrated circuit. On this occasion, current flows more easily in a plane parallel to a surface of the substrate in the thin film 203 (c-axis oriented thin film) while in the interlayer wiring 204, current flows more easily in a direction perpendicular to a surface of the substrate (a-axis oriented thin film), and further, in the thin film 206, current flows more easily in a plane parallel to a surface of the substrate (c-axis oriented thin film). This is an important feature of the device according to this example of the present invention.

Figure 16A:
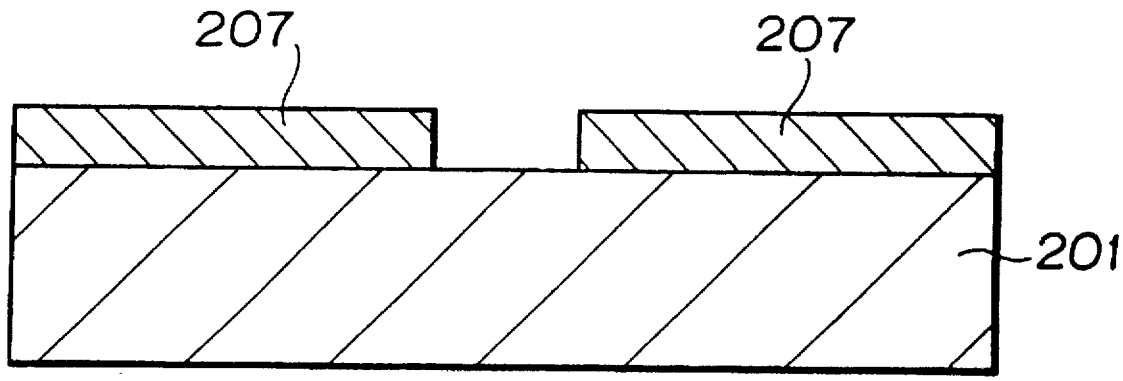
FIGS. 16A through 16D together illustrate a fabrication procedure for fabricating a superconducting vertical junction device according to Example 8 of the present invention, with FIGS. 16A, 16B, 16C and 16D being cross sectional views, respectively, showing a superconducting vertical junction device during a fabrication step.
Figure 16B:
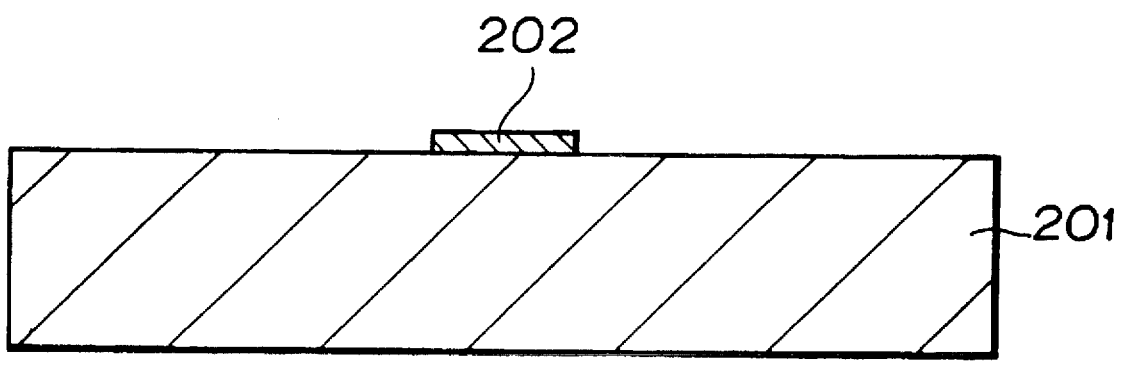
Figure 16C:
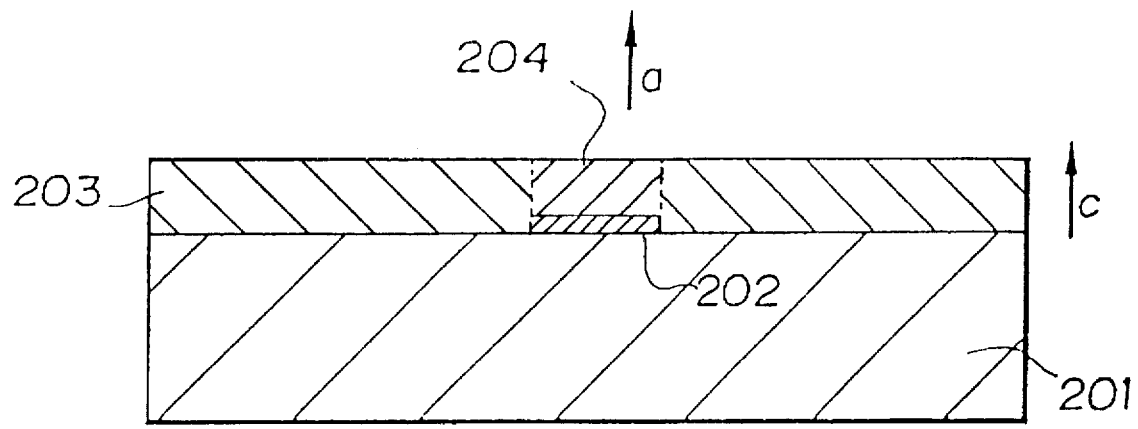
Figure 16D:
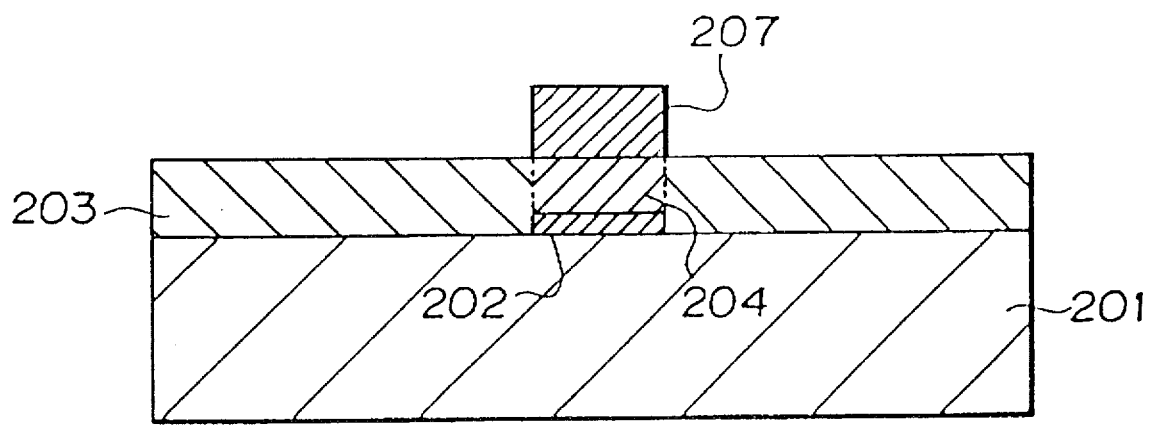

Next, fabrication of the device according to this example of the present invention will be explained referring to FIGS. 16A through 16D, in which reference numerals 201 to 206 designate the same or like parts or members shown in FIG. 15, and 207 is a mask. FIG. 16A illustrates the state in which the mask 207 is formed on, for example, a $SrTiO_3$ substrate 201 having a lattice mismatch with respect to $YBa_2Cu_3O_x$ of 1.1%. Then, for example, the $NdGaO_3$ layer 202 having a lattice mismatch with respect to $YBa_2Cu_3O_x$ of 0.3% is deposited on a portion other than that covered with the mask 207. After the mask 207 is removed, the structure shown in FIG. 16B is obtained. Then, on the overall surface of the substrate, there is deposited a $YBa_2Cu_3O_x$ thin film at a substrate temperature of 750° C., for example, which is shown by the broken line in FIG. 3. As a result, the c-axis oriented $YBa_2Cu_3O_x$ thin film 203 is deposited on the $SrTiO_3$ substrate 201 and the a-axis oriented $YBa_2Cu_3O_x$ thin film 204 is deposited on the $NdGaO_3$ thin film 202, as shown in FIG. 16C. Then, another mask 207 is arranged on the a-axis oriented $YBa_2Cu_3O_x$ thin film 204 serving as an interlayer wiring to obtain the structure shown in FIG. 16D. Next, the $SrTiO_3$ interlayer insulator 205 is deposited and the mask 207 is removed, followed by depositing the $YBa_2Cu_3O_x$ thin film 206 in an upper integrated circuit. As a result, the c-axis oriented thin film 206 grows on the $SrTiO_3$ interlayer insulator 205 while the a-axis oriented thin film grows on the interlayer wiring 204 as shown in FIG. 15. As described above, there can be realized c-axis oriented lower and upper thin films 203 and 206 that have an a-axis oriented thin film portions only in the interlayer wiring portions.

Example 9

Figure 17:
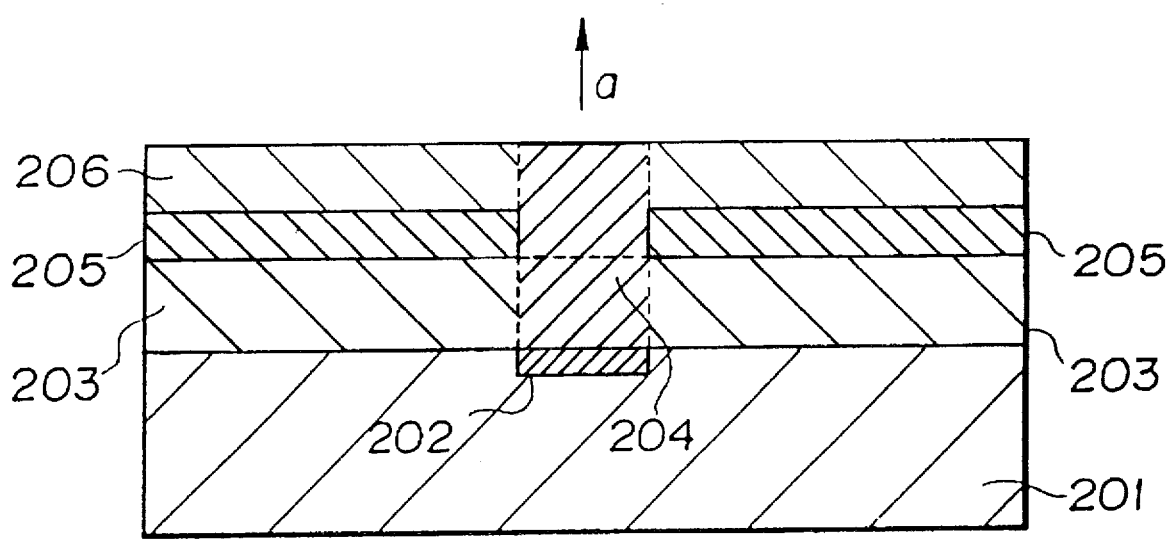
FIG. 17 is a schematical cross sectional view showing a superconducting vertical junction device according to Example 9 of the present invention.

FIG. 17 is a cross sectional view showing a superconducting vertical junction according to a ninth example of the present invention. In FIG. 17, reference numeral 201 designates a $SrTiO_3$ substrate, 202 is a $NdGaO_3$ thin film, 203 is a c-axis oriented $YBa_2Cu_3O_x$ thin film as a lower integrated circuit, 204 is an a-axis oriented $YBa_2Cu_3O_x$ thin film serving as an interlayer wiring, 205 is a $SrTiO_3$ interlayer insulator, and 206 is a c-axis oriented $YBa_2Cu_3O_x$ thin film which is a portion of an upper integrated circuit (not shown). This example differs from Example 1 in that in this example, before the $NdGaO_3$ thin film 202 is deposited on the $SrTiO_3$ substrate 201, the substrate 201 is etched to a depth equal to the thickness of the thin film 202 to be deposited subsequently with using a mask to protect a portion on which a junction is designed to be formed. This increases the contact area at which an a-axis oriented portion constituting the junction and a c-axis oriented portion constituting a wiring contact each other, i.e., current density, and additionally achieves leveling which increases the process margin.

While an explanation has been made hereinabove on the case where a lower electrode is embedded, the embedding of the interlayer insulator immediately below the upper integrated circuit as described in Examples 5 and 6 above increases the contact area in the boundary region at which an a-axis oriented portion constituting a junction of the upper electrode and a c-axis oriented portion constituting a wiring.

While explanation has been made above on the use of $SrTiO_3$ (lattice mismatch: 1.1%), $NdGaO_3$ (lattice mismatch: 0.3%) and, $YBa_2Cu_3O_x$ as a superconducting material thin film, it is obvious to one skilled in the art that the same effects can be obtained so far as a deposition temperature is set up at which temperature a superconducting thin film deposited on two different materials having different lattice mismatches one from another is a-axis oriented on one of the materials which has a smaller lattice mismatch and c-axis oriented on the other of the materials, i.e., the material having a larger lattice mismatch. In this example, the substrate itself and a thin film are used as materials on whose surfaces a lower integrated circuit is to be deposited. However, needless to say, the same or similar effects can be obtained with two or more thin film materials having different lattice mismatches deposited on the substrate in the same manner as the substrate surfaces prior to deposition of an upper electrode.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A superconducting thin film interlayer wiring comprising:

a substrate having a main surface;

first and second adjacent regions provided in parallel to said main surface of said substrate;

a lower superconducting thin film formed on said substrate in said first and second regions thereof and consisting essentially of a superconductor represented by a formula:

$$LnBa_2Cu_3O_x$$

wherein Ln represents an element selected from the group consisting of yttrium and a lanthanide, and $6<x<7$;

an upper superconducting thin film formed on said lower superconducting thin film and consisting essentially of said superconductor represented by said formula $LnBa_2Cu_3O_x$;

said superconducting thin films having both a larger coherent length region having a larger coherence length in a direction perpendicular to the main surface of said substrate, and a smaller coherent length region having a smaller coherence length in a direction perpendicular to the main surface of said substrate, the larger coherent length regions of said upper and lower superconducting thin films being provided in one of the first and second adjacent regions of the main surface of said substrate;

a first layer provided between said main surface of said substrate and said lower superconducting thin film in said first region of the main surface of said substrate, said first layer having a lattice mismatch with respect to said superconductor represented by said formula $LnBa_2Cu_3O_x$ different from the lattice mismatch of said substrate with respect to said superconductor;

a second layer provided between said lower superconducting thin film and said upper superconducting thin film in said smaller coherent length region, said second layer having a lattice mismatch with respect to said superconductor represented by formula $LnBa_2Cu_3O_x$;

whereby electron pairs are transmitted between said upper and lower superconducting thin films in said larger coherent length regions.

2. The superconducting thin film interlayer wiring as claimed in claim 1, wherein said substrate consists of a material selected from the group consisting of Nd: $YAlO_3$, $LaAlO_3$, $SrLaGaO_4$, $NdGaO_3$, $PrGaO_3$, $LaGaO_3$, $SrTiO_3$ and MgO.

3. The superconducting thin film interlayer wiring as claimed in claim 1, further comprising a third layer provided between said main surface of said substrate and said lower superconducting thin film in said second region, said third layer having a lattice mismatch with respect to said superconductor represented by said formula $LnBa_2Cu_3O_x$ different from the lattice mismatch of said first layer with respect to said superconductor.

4. A lattice matching device comprising:

a first member having a main surface, said main surface having first and second adjacent parts;

a second member provided on the first part of the main surface of said first member;

a superconducting thin film having first and second adjacent portions, said first portion being formed on the second part of the main surface of the first member, and said second portion being formed on a surface of said second member;

said first and second members having different lattice mismatches with respect to a superconductor represented by $LnBa_2Cu_3O_x$ wherein Ln represents an element selected from the group consisting of yttrium and a lanthanide, and $6<x<7$;

said first and second portions of said superconducting thin film consisting essentially of a superconductor represented by said formula $LnBa_2Cu_3O_x$;

said first and second portions having first and second different orientation axes perpendicular to said main surface of said first member;

wherein said first member is a substrate, and said second member is a thin film layer; and wherein each of the first and second portions of said superconducting thin film consists of an upper layer and a lower layer, the upper and lower layers of the first portion of said superconducting thin film having larger coherence lengths in a direction parallel to said substrate and the upper and lower layers of the second portion of said superconducting thin film having larger coherence lengths in a direction perpendicular to said substrate, whereby electron pairs are transmitted parallel to said substrate in the upper and lower layers of the first portion of said superconducting thin film and perpendicular to said substrate in the upper and lower layers of the second portion of said superconducting thin film.

5. The lattice matching device as claimed in claim 4, wherein the upper and lower layers are joined through an insulator thin film provided therebetween, said insulator thin film having first and second portions formed on said first and second portions, respectively, of said lower layer of said superconducting thin film, and said first portion of said insulator thin film having a lattice mismatch with respect to said superconductor different from the lattice mismatch of said second portion of said insulator thin film with respect to said superconductor.

* * * * *